(12) United States Patent
Chen et al.

(10) Patent No.: US 12,707,947 B2
(45) Date of Patent: Aug. 11, 2026

(54) STRUCTURES FOR REDUCING GAP FILL DEFECTS IN A VERTICALLY STACKED SEMICONDUCTOR DEVICE AND METHODS FOR FORMING THE SAME

(71) Applicant: Taiwan Semiconductor Manufacturing Company Limited, Hsinchu (TW)

(72) Inventors: Hsien-Wei Chen, Hsinchu City (TW); Meng-Liang Lin, Hsinchu (TW); Ying-Ju Chen, Tuku Township (TW); Shin-Puu Jeng, Po-Shan Village (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 405 days.

(21) Appl. No.: 18/323,455

(22) Filed: May 25, 2023

(65) Prior Publication Data

US 2024/0395610 A1 Nov. 28, 2024

(51) Int. Cl.

| | |
|---|---|
| ***H10W 20/00*** | (2026.01) |
| ***H10D 30/63*** | (2025.01) |
| ***H10P 52/00*** | (2026.01) |
| ***H10P 52/40*** | (2026.01) |
| ***H10W 42/60*** | (2026.01) |
| ***H10W 74/01*** | (2026.01) |
| ***H10W 74/15*** | (2026.01) |

(52) U.S. Cl.

CPC .......... *H10W 20/098* (2026.01); *H10D 30/63* (2025.01); *H10P 52/00* (2026.01); *H10P 52/403* (2026.01); *H10W 42/60* (2026.01); *H10W 74/012* (2026.01); *H10W 74/15* (2026.01)

(58) Field of Classification Search

CPC ............. H01L 21/76837; H01L 21/304; H01L 21/3212; H01L 21/563; H01L 21/561; H01L 2225/06513; H01L 25/0657; H01L 23/3135

See application file for complete search history.

(56) References Cited

U.S. PATENT DOCUMENTS

| | | | | |
|---|---|---|---|---|
| 9,620,430 | B2 * | 4/2017 | Lu | H01L 21/563 |
| 10,276,551 | B2 * | 4/2019 | Lin | H01L 23/24 |
| 12,564,077 | B2 * | 2/2026 | Liang | H10W 70/60 |

(Continued)

*Primary Examiner* — Sue A Purvis
(74) *Attorney, Agent, or Firm* — The Marbury Law Group, PLLC

(57) ABSTRACT

Vertically stacked semiconductor devices and methods of fabrication thereof that include a first semiconductor die bonded to a second device structure in a face-down configuration, a gap fill dielectric layer laterally surrounding the first semiconductor die, and a recess fill dielectric layer formed over the gap fill dielectric layer to fill concave recess defects in the gap fill dielectric that may result from cracks in the first semiconductor die. The recess fill dielectric layer may fill the entire volume of one or more concave recess defects in the gap fill dielectric material to a vertical depth of 5 μm or more below the backside surface of a semiconductor substrate of the first semiconductor die. Providing a recess fill dielectric layer within concave recess defects in the gap fill dielectric layer may result in enhanced protection against electrical arcing during subsequent processing steps and thereby provide improved device yields.

20 Claims, 20 Drawing Sheets

(56) References Cited

U.S. PATENT DOCUMENTS

| | | | | |
|---|---|---|---|---|
| 2013/0119533 | A1* | 5/2013 | Chen | H01L 24/97<br>257/737 |
| 2016/0163650 | A1* | 6/2016 | Gao | H01L 23/3128<br>438/126 |
| 2024/0421126 | A1* | 12/2024 | Ni | H10W 42/00 |

* cited by examiner 120
207
204
203
201
121
218
131
118
101
103
105
104
107
108
208
205
100
200

STRUCTURES FOR REDUCING GAP FILL DEFECTS IN A VERTICALLY STACKED SEMICONDUCTOR DEVICE AND METHODS FOR FORMING THE SAME

BACKGROUND

The semiconductor industry has grown due to continuous improvements in integration density of various electronic components (e.g., transistors, diodes, resistors, capacitors, etc.).

In addition to smaller electronic components, improvements to the packaging of components have been developed in an effort to provide smaller packages that occupy less area than previous packages. Example approaches include quad flat pack (QFP), pin grid array (PGA), ball grid array (BGA), flip chips (FC), three-dimensional integrated circuits (3DICs), wafer level packages (WLPs), package on package (POP), System on Chip (SoC) or System on Integrated Circuit (SoIC) devices. Some of these three-dimensional devices are prepared by placing chips over chips. These three-dimensional devices provide improved integration density and other advantages because of the decreased length of interconnects between the stacked chips. However, there are many challenges related to three-dimensional devices.

BRIEF DESCRIPTION OF THE DRAWINGS

Aspects of this disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
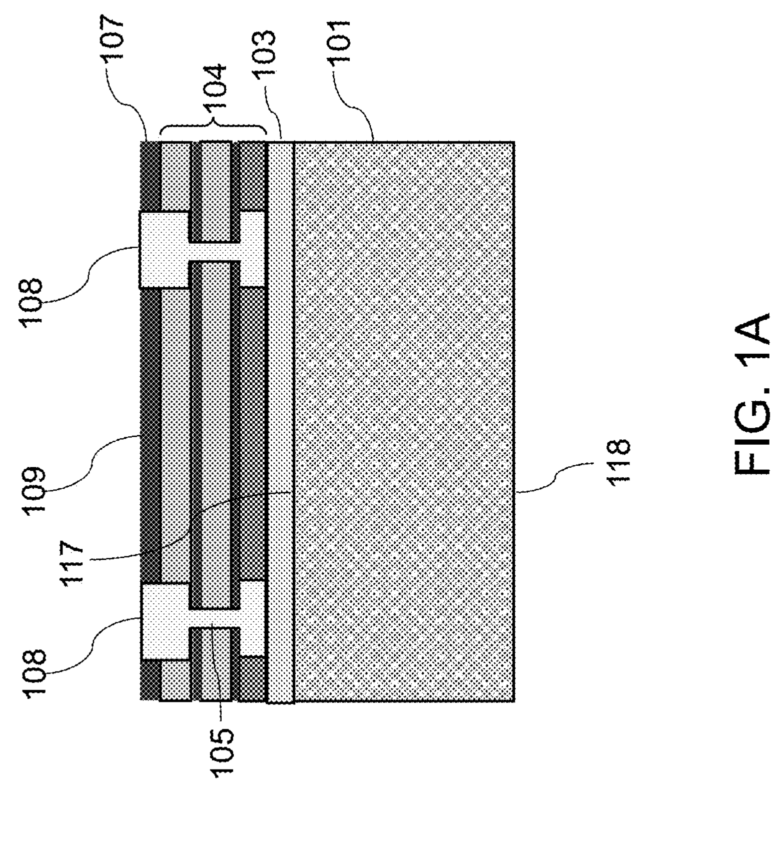
FIG. 1A is a vertical cross-section view illustrating a first semiconductor die according to an embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper,” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

Various embodiments disclosed herein are directed to semiconductor devices, and specifically to vertically stacked semiconductor devices that include at least one semiconductor die stacked over and bonded to a second device structure, which may be, for example, another semiconductor die or a semiconductor wafer. The at least one semiconductor die may be vertically stacked in a configuration such as a system on integrated chip (SoIC), chip on wafer on substrate (CoWoS), chip on wafer (CoW), etc. Such vertically stacked semiconductor devices may increase the density of devices that may occupy a given planar area or “footprint.”

Semiconductor dies may include a semiconductor material substrate, such as a silicon substrate, having a number of circuit components and elements formed on and/or within the semiconductor material. Semiconductor dies are typically fabricated by sequentially depositing insulating or dielectric layers, conductive layers, and semiconductive layers of material over a semiconductor substrate (e.g., a wafer), patterning the various material layers using lithography to form integrated circuits, and separating individual dies from the substrate such as by sawing between the integrated circuits along scribe lines.

A vertically stacked semiconductor device may be formed by picking up individual semiconductor dies (e.g., using a pick-and-place tool) and placing each die on a surface of a second device structure, which may include another semiconductor die and/or a support substrate (e.g., a semiconductor wafer). The semiconductor dies may be placed on the surface of the second device structure in a “face down” configuration, meaning that the semiconductor die may be flipped over (i.e., inverted) such that the integrated circuit components formed on a first (i.e., front) side of the semiconductor substrate face towards the surface of the second device structure and a second (i.e., back) side of the semiconductor substrate is located at the top of the semiconductor die facing away from the second device structure. A bonding process may be used to bond bonding features on the semiconductor die to corresponding bonding features on the surface of the second device structure. Following the bonding of the semiconductor die to the surface of the second device structure, a grinding or similar thinning process may optionally be used to remove portions of the semiconductor substrate from the top of the semiconductor die. This thinning of the semiconductor substrate may be done, for example, to reduce the overall height of the semiconductor die and/or to expose features (e.g., through-substrate conductive vias) located within the semiconductor substrate of the semiconductor die. A dielectric material, which may also be referred to as a gap fill material, may be provided around the semiconductor die to provide electrical isolation and structural support for the vertically stacked semiconductor device structure. A planarization process may be utilized to remove portions of the gap fill material from over the surface of the semiconductor substrate of the semiconductor die such that the semiconductor substrate and the gap fill material may form a continuous planar upper surface.

In some instances, the grinding process used to thin the semiconductor substrate of the semiconductor die may result in chipping or cracking of the semiconductor substrate, particularly around the edges and corner regions of the semiconductor substrate. In embodiments in which the gap fill material is deposited over and around the semiconductor die and subsequently planarized, the upper surface of the gap fill material may not be fully coplanar with the upper surface of the semiconductor substrate of the semiconductor die due to the presence of one or more cracks in the semiconductor die. Accordingly, the upper surface of the gap fill material may include concave recessed portions in regions near cracked or chipped portions of the substrate. Such concave recessed portions of the gap fill material (which may also be referred to as “concave recess defects”) may create an unacceptable risk of electrical arcing during subsequent processing steps, such as plasma-assisted etching and/or material deposition processes, which can damage underlying structures and reduce device yields.

In order to reduce the risk of electrical arcing due to the presence of concave recess defects in a gap fill material, various embodiments disclosed herein may include vertically stacked semiconductor devices and methods of fabrication thereof that include a recess fill dielectric layer that is formed over the gap fill material and fills any concave recess defects in the gap fill material. The recess fill dielectric layer may be formed by depositing a suitable dielectric material over the backside surface of the semiconductor die substrate, the upper surface of the gap fill material and within any concave recess defects in the gap fill material. A planarization process, such as a chemical mechanical planarization (CMP) or an etching process, may be used to remove excess portions of the recess fill dielectric layer such that a vertical height of the upper surface of the recess fill dielectric layer may be between about 0 μm and about 10 μm above the backside surface of the semiconductor die substrate. In some embodiments, the recess fill dielectric layer may fill the entire volume of one or more concave recess defects in the gap fill material to a vertical depth of 5 μm or greater below the backside surface of the semiconductor die substrate. Suitable dielectric materials for the recess fill dielectric layer may include, for example, an oxide material, such as silicon oxide, undoped silicate glass (USG), etc., and/or an organic dielectric material having a low viscosity and high solid content, such as a molding underfill (MUF) material. In various embodiments, providing a recess fill dielectric layer within concave recess defects in the gap fill material may result in enhanced protection against electrical arcing during subsequent processing steps, such as plasma-assisted etching and/or material deposition processes, and thereby provide improved yields for vertically stacked semiconductor devices.

FIGS. 1A-10B are sequential vertical cross-section views illustrating the intermediate structures during a process of fabricating a vertically stacked semiconductor device according to various embodiments of the present disclosure. FIG. 1A is a vertical cross-section view illustrating a first semiconductor die 100 according to an embodiment of the present disclosure. The first semiconductor die 100 may include a first semiconductor substrate 101 that may include an elementary semiconductor such as silicon or germanium and/or a compound semiconductor such as silicon germanium, silicon carbide, gallium arsenic, indium arsenide, gallium nitride, or indium phosphide, or combinations of the same. Other semiconductor substrate materials are within the contemplated scope of disclosure. In some embodiments, the first semiconductor substrate 101 may be a semiconductor-on-insulator (SOI) substrate.

The first semiconductor substrate 101 may include a first major surface (i.e., a front side surface 117) and a second major surface (i.e., a backside surface 118). In some embodiments, a thickness of the first semiconductor substrate 101 between the front side surface 117 and the backside surface 118 may be between about 500 μm and about 800 μm, although a semiconductor substrate 101 having a greater or lesser thickness may also be utilized. A first device level 103 may be disposed on/in the front side surface 117 of the first semiconductor substrate 101. The first device level 103 may include a plurality of devices, which may include active devices, passive devices, or a combination thereof. In some embodiments, the devices in the first device level 103 may include integrated circuit devices. The devices may be, for example, transistors (e.g., field-effect transistors (FETs)), capacitors, resistors, diodes, photodiodes, fuse devices, or other similar devices. In some embodiments, the first device level 103 may include gate electrodes, source/drain regions, spacers, and the like.

The first semiconductor die 100 may also include a first interconnect structure located over the first device level 103 on the front side surface 117 of the first semiconductor substrate 101. The first interconnect structure may include metal features 105 embedded in dielectric material 104. The dielectric material 104 may include one or more layers of dielectric material, such as at least one inter-layer dielectric (ILD) layer and/or at least one inter-metal dielectric (IMD) layer. The one or more layers of dielectric material 104 may be formed of suitable dielectric materials such as silicon oxide ($SiO_2$) silicon nitride (SiN, $Si_3N_4$), silicon carbide (SiC), or the like. Other dielectric materials are within the contemplated scope of disclosure. The one or more layers of dielectric material 104 may be deposited using any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a low pressure CVD process, a metalorganic CVD (MOCVD) process, a plasma enhanced CVD (PECVD) process, a sputtering process, laser ablation, or the like.

In various embodiments, the metal features 105 of the first interconnect structure may include a plurality of metal vias and metal lines extending within the dielectric material 104. The metal features 105 may be formed of any suitable electrically conductive material, such as copper (Cu), tungsten (W), and aluminum (Al), including alloys and combinations thereof. Other electrically conductive materials are within the contemplated scope of disclosure. In some embodiments, a barrier layer (not shown) may be disposed between the metal features 105 and the dielectric material 104 to prevent diffusion of the electrically conductive material of the metal features 105 to surrounding features. The barrier layers may include Ta, TaN, Ti, TiN, CoW, or combinations thereof, for example. Other barrier layer materials are within the contemplated scope of disclosure. The metal features 105 and the optional barrier layers may be formed using a suitable deposition process, such as, for example, physical vapor deposition (PVD), sputtering, chemical vapor deposition (CVD), atomic layer deposition (ALD), plasma-enhanced chemical vapor deposition (PECVD), electrochemical deposition (e.g., electroplating), or combinations thereof. The metal features 105 of the first interconnect structure may be configured to route electrical signals to and from, and/or in between, various devices of the first semiconductor die 100, some or all of which may be located on the first device layer level 103.

The first semiconductor die 100 may further include first bonding features disposed over the first interconnect structure. In the embodiment shown in FIG. 1A, the first bonding features include a first bonding layer 107 including a plurality of metal bond pads 108 laterally surrounded by a dielectric material layer 109. The dielectric material layer 109 of the first bonding layer 107 may be formed of a suitable dielectric material, such as silicon oxide, silicon nitride, silicon oxynitride, or the like, and may be formed using a suitable deposition process as described above. The metal bond pads 108 of the first bonding layer 107 may be formed of a suitable metallic material, such as copper (Cu), tungsten (W), aluminum (Al), combinations and alloys thereof, or the like, and may be formed via a suitable deposition process as described above. At least some of the metal bond pads 108 may be coupled to metal features 105 of the underlying first interconnect structure. In various embodiments, the upper surfaces of each of the metal bond pads 108 may be coplanar with the upper surface of the dielectric material layer 109 such that the first bonding layer 107 may include a continuous planar upper surface. The first bonding layer 107 may be configured to enable bonding of the first semiconductor die 100 to a second device structure via a direct bonding technique, such as a metal-metal (M-M) and dielectric-dielectric (D-D) bonding technique, as described in further detail below. However, it will be understood that other suitable first bonding features may be utilized for bonding the first semiconductor die 100 to a second device structure using a different bonding technique, such as via a microbump and/or a solder-based bonding technique.

Figure 1B:
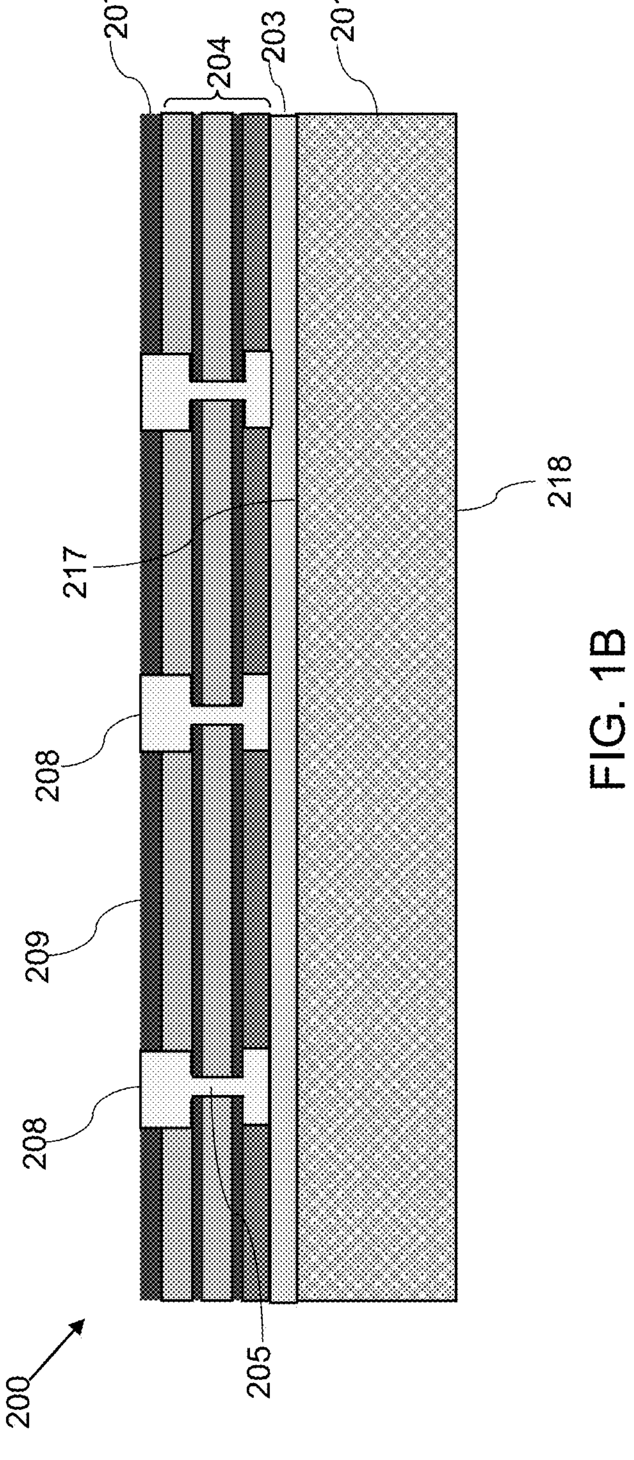
FIG. 1B is a vertical cross-section view illustrating a second device structure according to an embodiment of the present disclosure.

FIG. 1B is a vertical cross-sectional view illustrating a second device structure 200 according to an embodiment of the present disclosure. In the embodiment of FIG. 1B, the second device structure 200 is a second semiconductor die 200, although it will be understood that in other embodiments the second device structure 200 may be another structure, such as support substrate (e.g., a semiconductor wafer). The second semiconductor die 200 shown in FIG. 1B may have a similar structure as the first semiconductor die 100 described above with reference to FIG. 1A. The second semiconductor die 200 may include a second semiconductor substrate 201. The second semiconductor substrate 201 may be composed of the same semiconductor material as the first semiconductor substrate 101, or may be composed of a different semiconductor material. The second semiconductor substrate 201 may include a first major surface (i.e., a front side surface 217) and a second major surface (i.e., a backside surface 218). A thickness of the second semiconductor substrate 201 between the front side surface 217 and the backside surface 218 may be the same as the thickness of the first semiconductor substrate 101, or may be different than the thickness of the first semiconductor substrate 101. In some embodiments, the second semiconductor substrate 201 may have at least one horizontal dimension (i.e., length and/or width) that is greater than the corresponding horizontal dimension of the first semiconductor substrate 101.

Referring again to FIG. 1B, a second device level 203 may be disposed on/in the front side surface 217 of the second semiconductor substrate 201, and a second interconnect structure including metal features 205 (e.g., metal lines and vias) embedded in a dielectric material 204, may be located over the second device level 203. The second device level 203 and the second interconnect structure of the second semiconductor die 200 may be similar to the first device level 103 and the first interconnect structure of the first semiconductor die 100 described above with reference to FIG. 1A. Thus, repeated discussion of like components is omitted for brevity.

The second device structure (e.g., a second semiconductor die 200 in the embodiment shown in FIG. 1B) may also include a second bonding features disposed over the front side of the second device structure. In the embodiment second semiconductor die 200 shown in FIG. 1B, the second bonding features include a second bonding layer 207 over the second interconnect structure. As with the first bonding layer 107 described above, the second bonding layer 207 may include plurality of metal bond pads 208 laterally surrounded by a dielectric material layer 209. At least some of the metal bond pads 208 of the second bonding layer 207 may be coupled to metal features 205 of the underlying second interconnect structure. The arrangement of the metal bond pads 208 in the second bonding layer 207 may correspond to the arrangement of the metal bond pads 108 in the first bonding layer 107. The metal bond pads 208 and the dielectric material layer 209 of the second bonding layer 207 may be formed of suitable materials using suitable processes as described above with reference to the first bonding layer 107 shown in FIG. 1A. In some embodiments, the metal bond pads 208 and the dielectric material layer 209 of the second bonding layer 207 may be composed of the same materials as the metal bond pads 108 and the dielectric material layer 109 of the first bonding layer 107 of the first semiconductor die 100. The metal bond pads 208 and the dielectric material layer 207 in the second bonding layer 207 may form a continuous planar upper surface. The second bonding layer 207 may be configured to enable a metal-metal (M-M) and dielectric-dielectric (D-D) direct bonding between the second bonding layer 207 of the second device structure 200 and the first bonding layer 107 of the first semiconductor die 100 and thereby bond the first semiconductor die 100 onto the front side of second device structure 200. However, it will be understood that other suitable second bonding features may be utilized for bonding the first semiconductor die 100 to the front surface of the second device structure 200 using a different bonding technique, such as via a microbump and/or a solder-based bonding technique.

Figure 2:
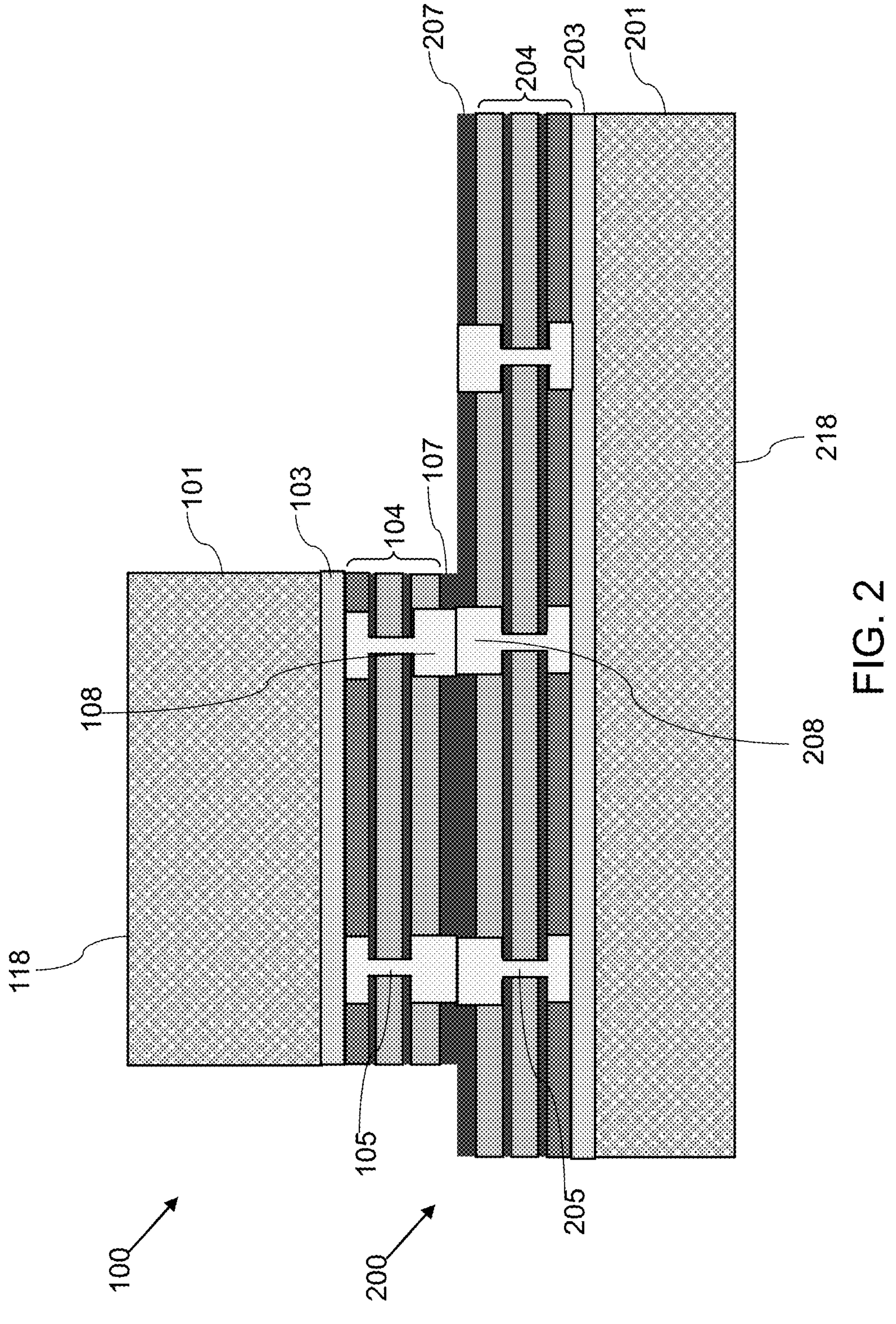
FIG. 2 is a vertical cross-section view of an intermediate structure during a process of forming a vertically stacked semiconductor device illustrating the first semiconductor die bonded to the second device structure according to an embodiment of the present disclosure.

FIG. 2 is a vertical cross-section view of an exemplary intermediate structure during a process of forming a vertically stacked semiconductor device illustrating the first semiconductor die 100 bonded to the second device structure 200 according to various embodiments of the present disclosure. In various embodiments, the first semiconductor die 100 may be bonded to the second device structure 200 (e.g., a second semiconductor die 200) using a metal-metal (M-M) and dielectric-dielectric (D-D) direct bonding process. In some embodiments, the surfaces of the first bonding layer 107 on the first semiconductor die 100 and the second bonding layer 207 on the second device structure 200 may optionally be subjected to a pre-treatment process (e.g., a plasma treatment process) to promote surface activation of the first bonding layer 107 and the second bonding layer 207. The first semiconductor die 100 may be inverted (i.e., flipped-over) relative to its orientation shown in FIG. 1A, aligned over the second device structure 200, and placed face-down onto the front side of the second device structure 200 (e.g., using a pick-and-place tool), such that the first bonding layer 107 on the first semiconductor die 100 contacts the second bonding layer 207 on the second device structure 200. The backside surface 118 of the first semiconductor substrate 101 may face away from the second device structure 200 and may form the upper surface of the first semiconductor die 100. The first semiconductor die 100 may be aligned over the front surface of the second device structure 200 such that the metal bond pads 108 in the first bonding layer 107 of the first semiconductor die 100 contact corresponding metal bond pads 208 in the second bonding layer 207 of the second device structure 200 and the surface of the dielectric material layer 109 of the first bonding layer 107 of the first semiconductor die 100 contacts the surface of the dielectric material layer 209 of the second bonding layer 207 of the second device structure 200. Interdiffusion of the metal materials of the respective metal bond pads 108 and 208 and the dielectric materials of the respective dielectric material layers 109 and 209 may cause the first bonding layer 107 of the first semiconductor die 100 to become bonded to the second bonding layer 207 of the second device structure 200. In some embodiments, the bonding of the first semiconductor die 100 to the second device structure 200 may be performed at an ambient temperature (e.g., ~20° C.). One or more annealing processes at an elevated temperature (e.g., ≥100° C., such as between about 150° C. and about 450° C.) may optionally be performed to strengthen the bond between the first semiconductor die 100 and the second device structure 200. In some embodiments, the initial bonding between the first semiconductor die 100 and the second device structure 200 may be performed at an elevated temperature and/or while a compressive force is applied between the first semiconductor die 100 and the second device structure 200. The bond formed between the respective first and second bonding layers 107 and 207 may provide a mechanical and electrical connection between the first semiconductor die 100 and the second device structure 200.

As discussed above, although a metal-metal (M-M) and dielectric-dielectric (D-D) direct bonding process is illustrated in the embodiment of FIG. 2, it will be understood that other bonding processes may be used to bond the first semiconductor die 100 to the second device structure 200. For example, a thermocompression bonding (TCB) process may be utilized to bond metallic structures (e.g., metal bumps, pillars and/or bonding pads) on the lower surface of the first semiconductor die 100 to corresponding metallic structures (e.g., metal bumps, pillars and/or bonding pads) on the upper surface of the second device structure 200. Alternatively, a solder-based bonding process may be utilized in which solder material portions (e.g., solder balls) may be disposed between metallic structures (e.g., metal bumps, pillars, under-bump metallization (UBM) structures, and/or bonding pads) on the lower surface of the first semiconductor die 100 and corresponding metallic structures (e.g., metal bumps, pillars, under-bump metallization (UBM) structures, and/or bonding pads) on the upper surface of the second device structure 200. A reflow process may be performed to cause the solder material portions to reflow and solidify to form solder bonds which provide a mechanical and electrical connection between the first semiconductor die 100 and the second device structure 200. Other suitable bonding techniques are also within the contemplated scope of the disclosure.

In addition, in the embodiment of FIG. 2, the first semiconductor die 100 and the second device structure 200 are bonded in a "face-to-face" configuration in which the front side surface of the first semiconductor die 100 (i.e., the surface of the first semiconductor die 100 opposite to the first semiconductor substrate 101) is bonded to the front side surface of the second device structure 200 (i.e., the surface of the second device structure 200 that is opposite to the second semiconductor substrate 201). In other embodiments (not shown), the first semiconductor die 100 may be bonded to the second device structure 200 are in a "face-to-back" configuration. In a face-to-back configuration, the second device structure 200 may be inverted (i.e., flipped-over) relative to its orientation shown in FIG. 2 such that the backside surface 218 of the second semiconductor substrate 201 may face upwards towards the front side of the first semiconductor die 100. A plurality of conductive members (e.g., through-substrate vias (TSVs)) may extend through the second semiconductor substrate 201 and may optionally be electrically coupled to devices located over the front side surface 217 of the second semiconductor substrate 201. A plurality of bonding features, such as metal bumps, pillars and/or bonding pads, may be formed over the backside surface 218 of the second semiconductor substrate 201 and may be bonded with corresponding bonding features on the front side of the first semiconductor die 100 to bond the first semiconductor die 100 to the back side of the second device structure 200.

Further, although the embodiment of FIG. 2 shows a single semiconductor die 100 bonded over the second device structure 200, it will be understood that in other embodiments, one or more additional device structures, such as additional semiconductor dies, may be bonded over the second device structure 200. Each of the additional device structures that are bonded over the second device structure 200 may be laterally spaced from the first semiconductor die 100.

Figure 3:
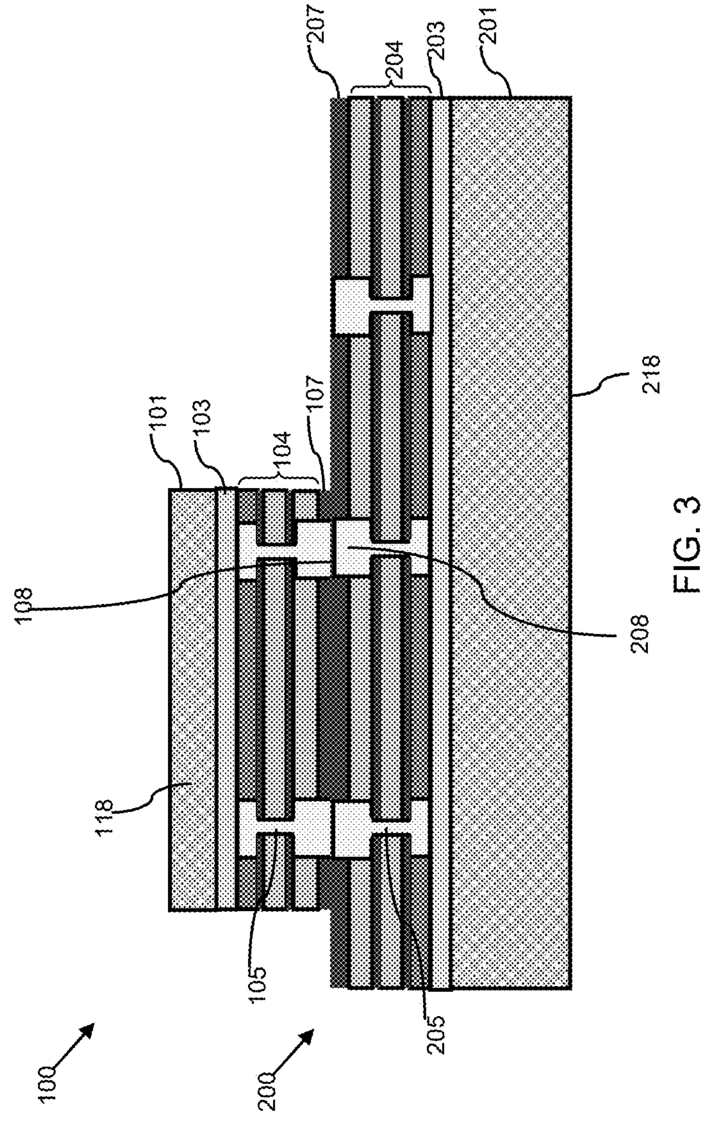
FIG. 3 is a vertical cross-section view of the intermediate structure following a thinning process to remove a backside portion of the first semiconductor substrate according to an embodiment of the present disclosure.

FIG. 3 is a vertical cross-section view of the intermediate structure following a thinning process to remove a backside portion of the first semiconductor substrate 101 according to various embodiments of the present disclosure. Referring to FIG. 3, a thinning process may be performed to remove a backside portion of the first semiconductor substrate 101 of the first semiconductor die 100. The thinning process may include, for example, a grinding process. In various embodiments, grinding equipment may be utilized to mechanically grind the backside surface 118 of the first semiconductor substrate 101 to remove material from the backside of the first semiconductor substrate 101 and reduce the thickness of the first semiconductor substrate 101. In various embodiments, the thickness of the first semiconductor substrate 101 may be reduced from an initial thickness that is between about 500 μm and about 800 μm to a second thickness that is between about 50 μm and about 100 μm. In some embodiments, the grinding equipment that is utilized for the grinding process may include a grind wheel having a very fine diamond grit. In some embodiments, the thinning process on the first semiconductor substrate 101 may expose one or more conductive via structures (e.g., through-substrate vias (TSVs), not shown in FIG. 3) in the backside surface 118 of the first semiconductor substrate 101.

Figure 4:
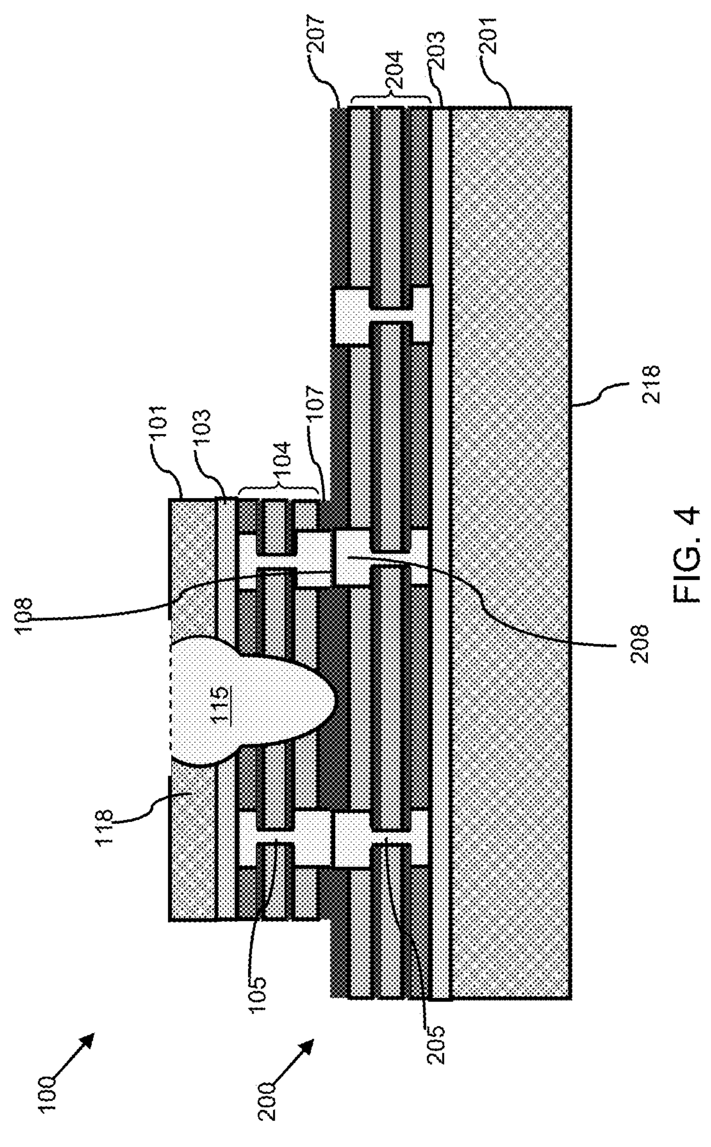
FIG. 4 is a vertical cross-section view of an intermediate structure following a thinning process that results in the formation of a crack in the first semiconductor die according to an embodiment of the present disclosure.

FIG. 3 illustrates an example in which the process of thinning the first semiconductor substrate 101 does not result in the formation of cracks in the first semiconductor die 100. However, in practice, this may not always be the case. FIG. 4 is a vertical cross-section view of an exemplary intermediate structure following a thinning process that results in the formation of a crack 115 in the first semiconductor die 101 according to various embodiments of the present disclosure. In some instances, the thinning process (e.g., grinding) that is utilized to reduce the thickness of the first semiconductor substrate 101 of the first semiconductor die 100 may result in the formation of one or more cracks 115 in the first semiconductor die 100. Without wishing to be bound by any particular theory, it is believed that particulate contaminants, such as dust particles having a diameter of 50 μm or less, may sometimes be present at the bonding interface between the first semiconductor die 100 and the second device structure 200. Then, during the subsequent process of thinning the first semiconductor substrate 101, these particulate contaminants may result in the generation of excessive stress on the first semiconductor die 100, causing one or more cracks 115 to form in the first semiconductor die 100. Depending on the size and/or location of the cracks 115, the crack 115 may not directly affect the functionality of the first semiconductor die 101 and may go undetected at the time of its occurrence. In many instances, one or more cracks 115 may form around an edge and/or within a corner region of the first semiconductor die 101.

Figure 5:
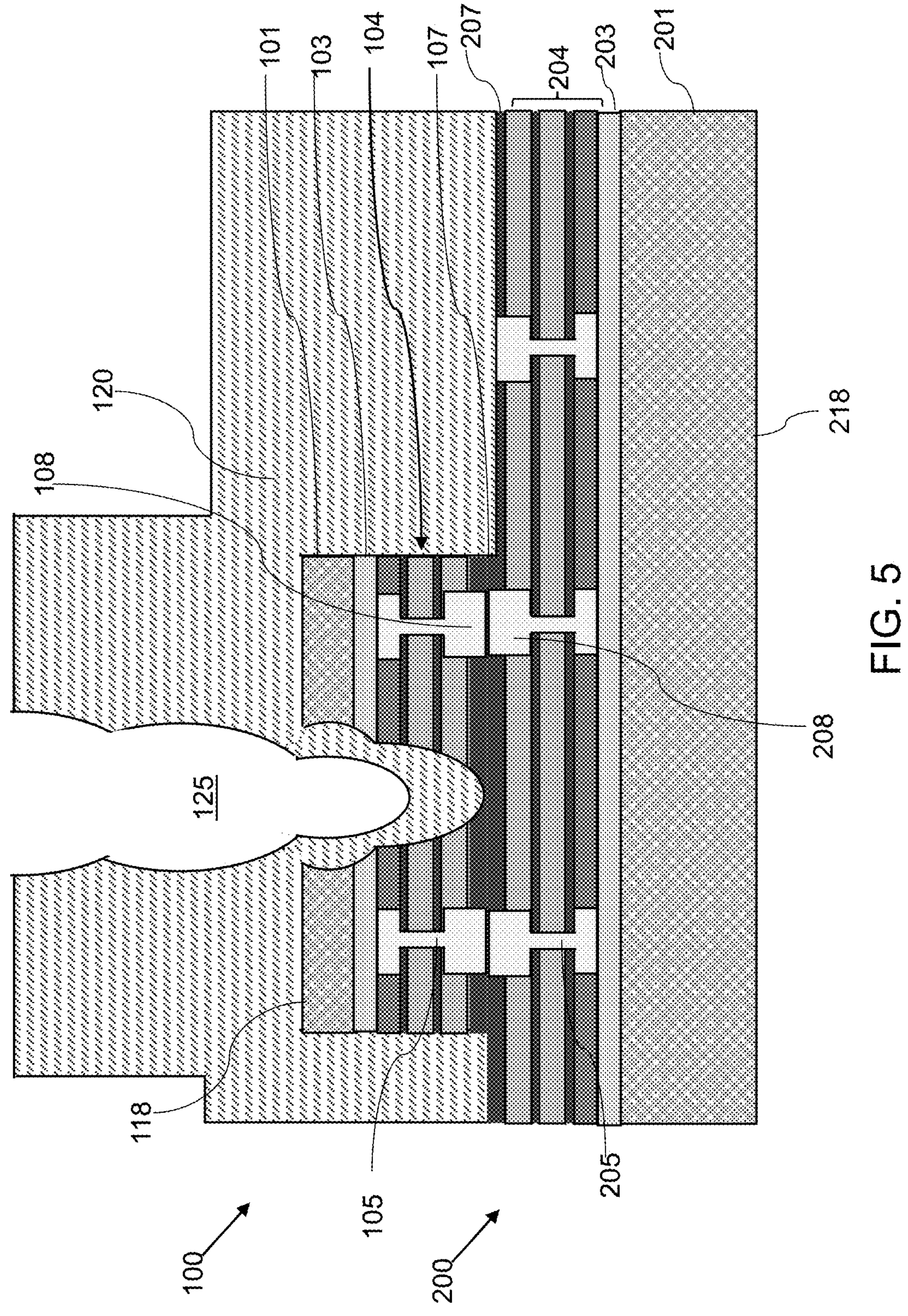
FIG. 5 is a vertical cross-section view of the intermediate structure including a gap fill dielectric layer formed over the second device structure and over the backside surface and side surfaces of the first semiconductor die according to an embodiment of the present disclosure.

FIG. 5 is a vertical cross-section view of the intermediate structure including a gap fill dielectric layer 120 formed over the second device structure 200 and over the backside surface 118 and side surfaces of the first semiconductor die 100 according to various embodiments of the present disclosure. Referring to FIG. 5, a gap fill dielectric layer 120 may be deposited over the exposed surface of the second device structure 200 and over the backside surface 118 and the side surfaces of the first semiconductor die 100. The gap fill dielectric layer 120 may laterally surround the first semiconductor die 100 and may at least partially fill any of the above-described cracks 115 in the first semiconductor die 100. In some instances, the presence of a crack 115 in and/or through the first semiconductor substrate 101 of the first semiconductor die 100 may result in a corresponding recessed portion 125 of the gap fill dielectric layer 120 corresponding to the location of the crack 115, as shown in FIG. 5.

The gap fill dielectric layer 120 may be composed of a suitable dielectric material, such as silicon oxide, silicon nitride, silicon carbide, silicon oxynitride, silicon carbon nitride, a low-K dielectric material, and extremely low-K (ELK) dielectric material, undoped silicon glass (USG), fluorosilicate glass (FSG), phosphor-silicate glass (PSG), etc., including combinations thereof. Other suitable dielectric materials for the gap fill dielectric layer 120 are within the contemplated scope of disclosure. The gap fill dielectric layer 120 may be deposited using a suitable deposition process as described above.

Figure 6A:
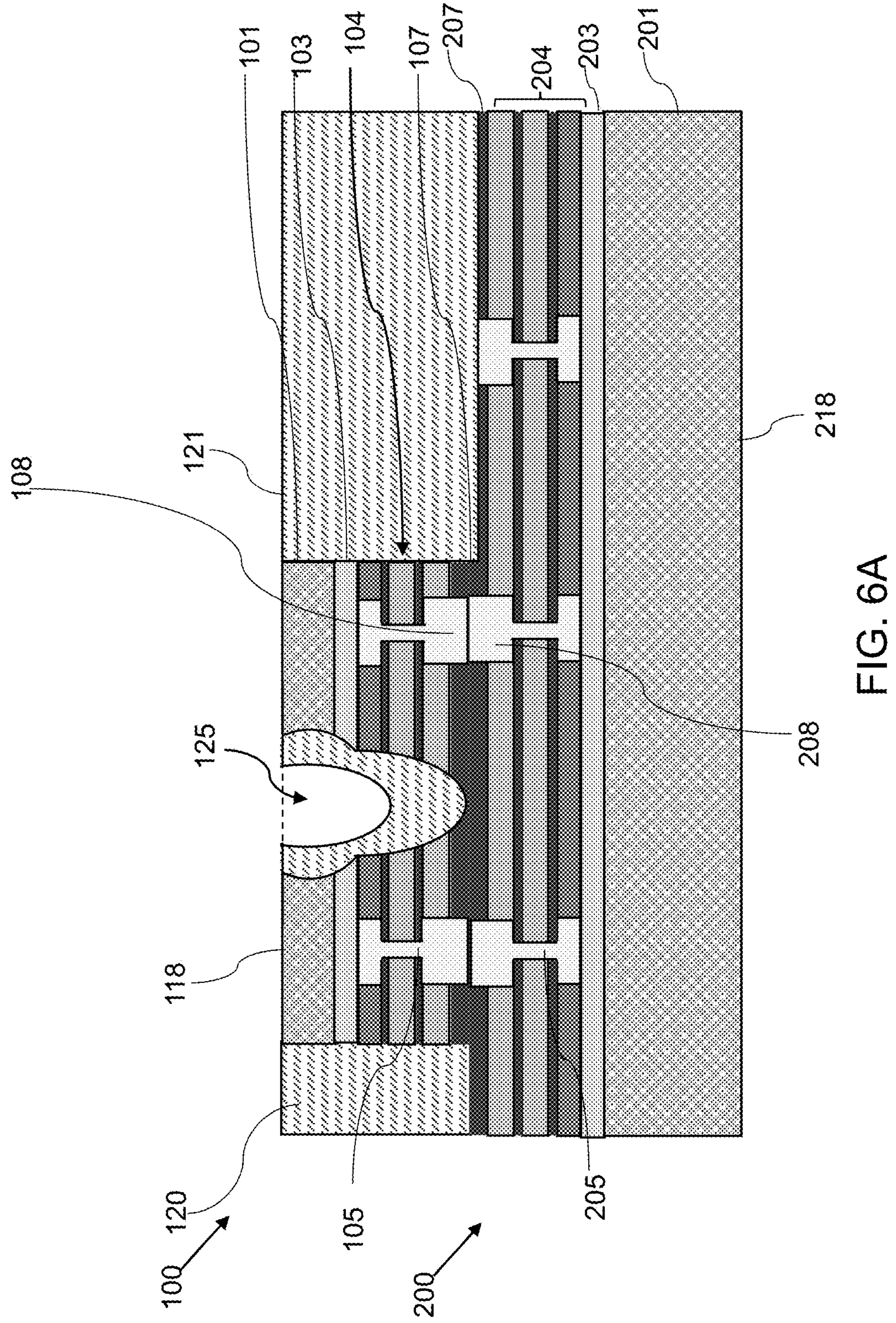
FIG. 6A is a vertical cross-section view of the intermediate structure following a planarization process that removes a portion of the gap fill dielectric layer from over the backside surface of the first semiconductor substrate according to an embodiment of the present disclosure.

FIG. 6A is a vertical cross-section view of the intermediate structure following a planarization process that removes a portion of the gap fill dielectric layer 120 from over the backside surface 118 of the first semiconductor substrate 101 according to various embodiments of the present disclosure. Referring to FIG. 6A, a planarization process, such as a chemical mechanical planarization (CMP) process, may be performed to remove portions of the gap fill dielectric layer 120 and expose the backside surface 118 of the first semiconductor substrate 101. Following the planarization process, an upper surface 121 of the gap fill dielectric layer 120 may be coplanar with the backside surface 118 of the first semiconductor substrate 101.

In embodiments in which the first semiconductor die 100 includes a crack 115 in and/or through the first semiconductor substrate 101, a concave recess defect 125 may be present in the gap fill dielectric layer 120 following the planarization process, as is shown in FIG. 6A. In other words, following the planarization process the upper surface 121 of the gap fill dielectric layer 120 may not be completely flat but may contain one or more recessed portions 125 that "bulge" inwardly below the plane of the backside surface 118 of the first semiconductor substrate 101. These concave recess defects 125 may correspond to the locations of cracks 115 in and/or through the first semiconductor substrate 101. The concave recess defects 125 may tend to be located around the peripheral edges and/or corner regions of the first semiconductor die 100. In the embodiment shown in FIG. 6A, the concave recess defect 125 is shown embedded within the first semiconductor die 100. Alternatively or in addition, one or more concave recess defects 125 may be located outside the first semiconductor die(s) 100. In some cases, a concave recess defect 125 may have a vertical depth of 5 μm or more. Accordingly, there may be relatively less dielectric material in the area of a concave recess defect 125, which may increase the risk of electrical arcing (e.g., point discharging, etc.) occurring during subsequent processing steps, such as during a subsequent plasma-assisted etching and/or plasma-assisted material deposition step. Such electrical arcing may result in damage to underlying structures in the first semiconductor die 100 and/or the second device structure 200, which may lead to reduced yields.

Figure 6B:
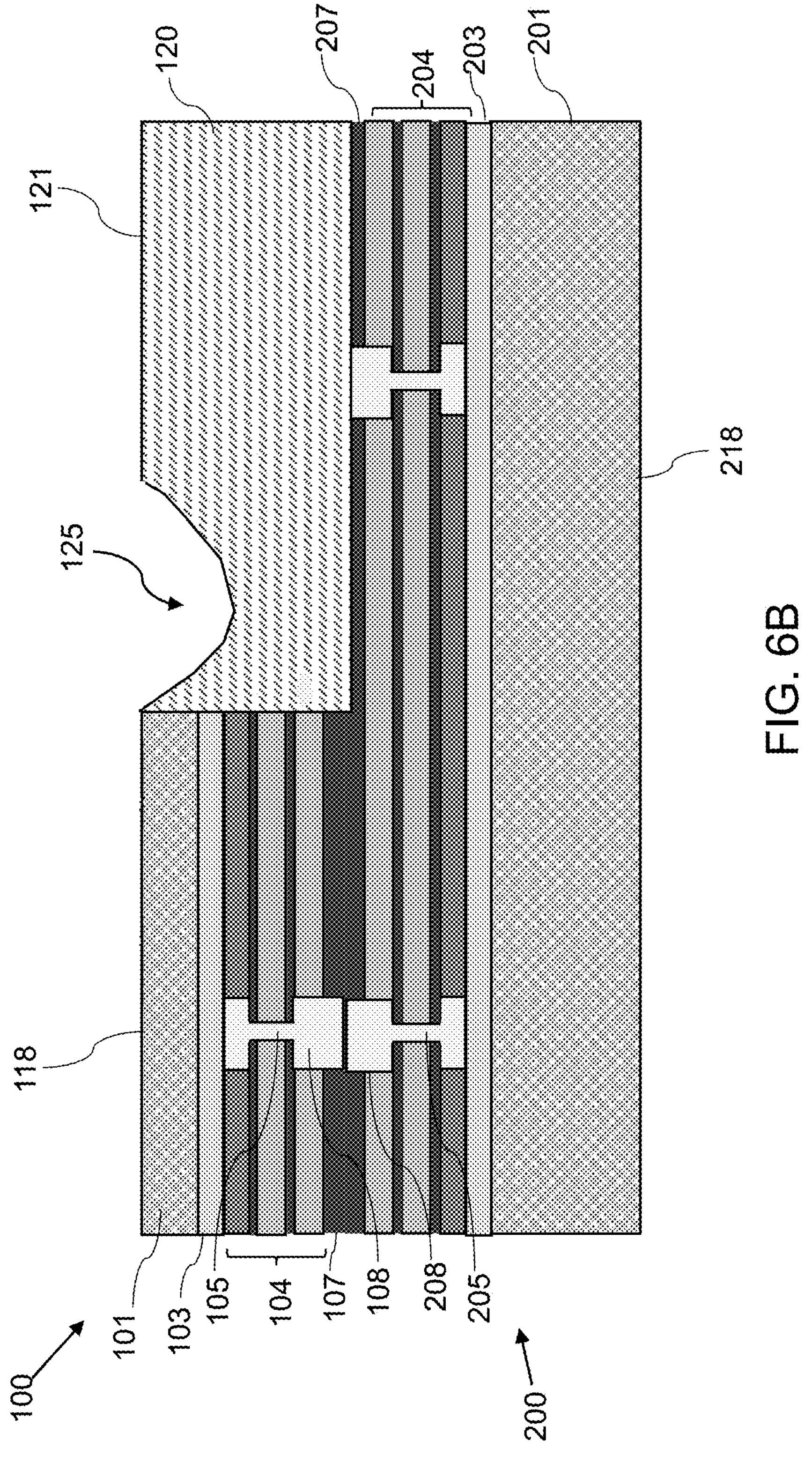
FIG. 6B is a vertical cross-section view of the intermediate structure following a planarization process that removes a portion of the gap fill dielectric layer from over the backside surface of the first semiconductor substrate according to another embodiment of the present disclosure.

FIG. 6B is a vertical cross-section view of the intermediate structure following a planarization process that removes a portion of the gap fill dielectric layer 120 from over the backside surface 118 of the first semiconductor substrate 101 according to another embodiment of the present disclosure. In the embodiment of FIG. 6B, a concave recess defect 125 in the gap fill dielectric layer 120 is located outside of (i.e., outside the periphery of) the first semiconductor die 100, such as around an edge and/or corner of the first semiconductor die 100. Such concave recess defects 125 may be the result of cracking or chipping around the edges of the first semiconductor die 100 during the above-described thinning process of the first semiconductor substrate 101. Accordingly, there may be relatively less dielectric material surrounding the first semiconductor die 100 in the area of a concave recess defect 125, which may increase the risk of electrical arcing occurring during subsequent processing steps.

Various embodiments of the present disclosure may address the issue of concave recess defects 125 in the gap fill dielectric layer 120 resulting in an increased risk of plasma-induced arcing damage in a vertically stacked semiconductor device by providing a recess fill dielectric layer, as described in further detail below.

Figure 7A:
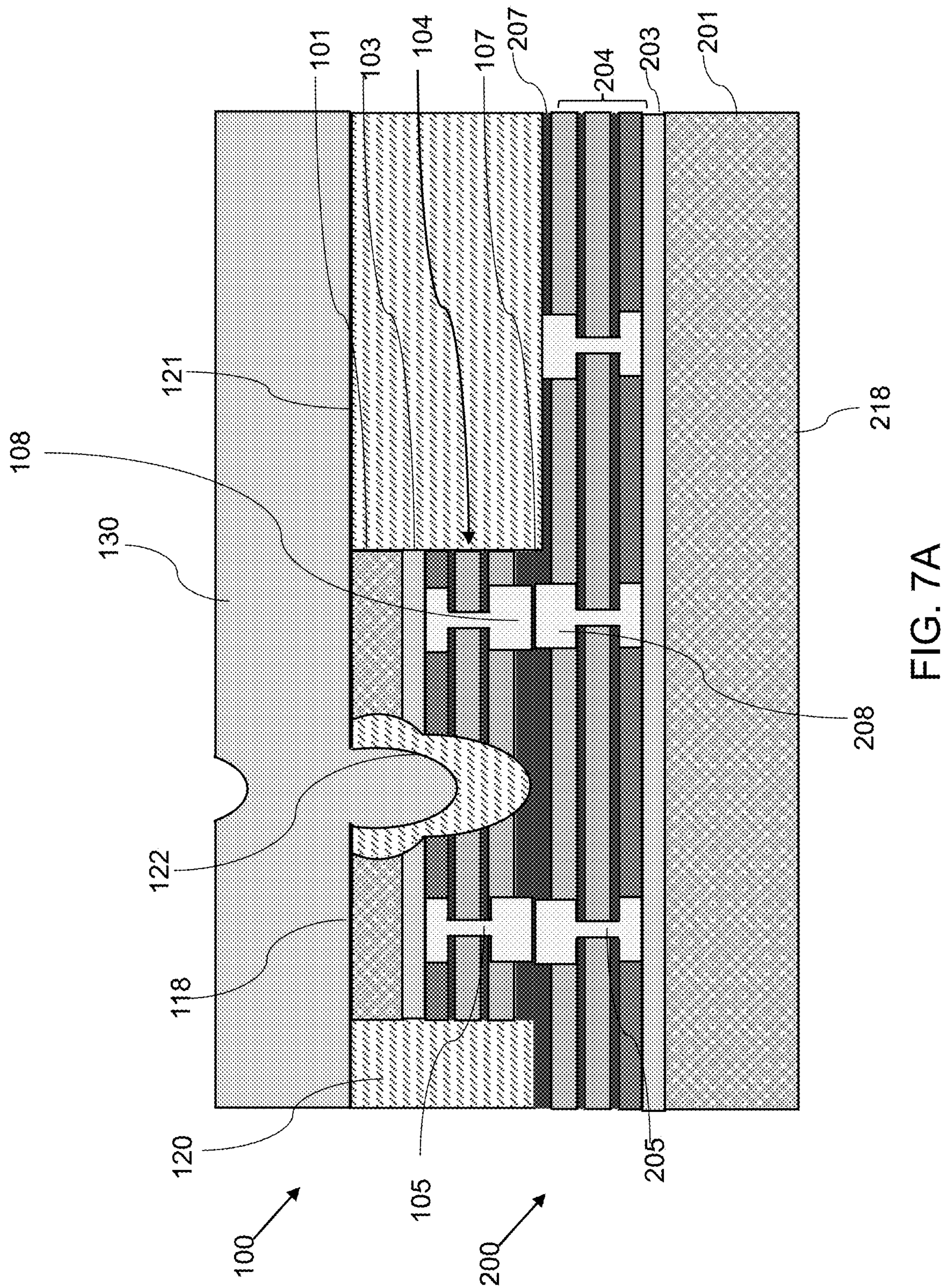
FIG. 7A is a vertical cross-section view of the intermediate structure including a recess fill dielectric layer formed over the backside surface of the first semiconductor die and the upper surface of the gap fill dielectric layer and within a concave recess defect in the gap fill dielectric layer according to an embodiment of the present disclosure.

FIG. 7A is a vertical cross-section view of the intermediate structure including a recess fill dielectric layer 130 formed over the backside surface 118 of the first semiconductor substrate 101 and the upper surface 121 of the gap fill dielectric layer 120 and within the concave recess defect 125 in the gap fill dielectric layer 120 according to various embodiments of the present disclosure. Referring to FIG. 7A, a recess fill dielectric layer 130 may be deposited over the backside surface 118 of the first semiconductor substrate 101 and the upper surface 121 of the gap fill dielectric layer 120. The recess fill dielectric layer 130 may fill the entire volume of each of the above-described concave recess defects 125 in the gap fill dielectric layer 120. The recess fill dielectric layer 130 may be composed of any suitable dielectric material as described above and may be deposited using a suitable deposition method as described above. In some embodiments, the recess fill dielectric layer 130 may include an oxide material, such as silicon oxide. In embodiments in which the gap fill dielectric layer 120 is composed of an oxide material, the recess fill dielectric layer 130 may be formed using a selective oxide (SelOx) deposition method that promotes preferential growth of the recess fill dielectric layer 130 on oxide-containing surfaces compared to non-oxide-containing surfaces. In some embodiments, the recess fill dielectric layer 130 may include undoped silicate glass (USG). In some embodiments, the recess fill dielectric layer 130 may be deposited using a high density plasma chemical vapor deposition (HDPCVD) deposition method. In some embodiments, the recess fill dielectric layer 130 may composed of the same material as the gap fill dielectric layer 120. An interface 122 may be located between the gap fill dielectric layer 120 and the recess fill dielectric layer 130. Alternatively, the recess fill dielectric layer 130 may be composed of a different material than the gap fill dielectric layer 120.

Figure 7B:
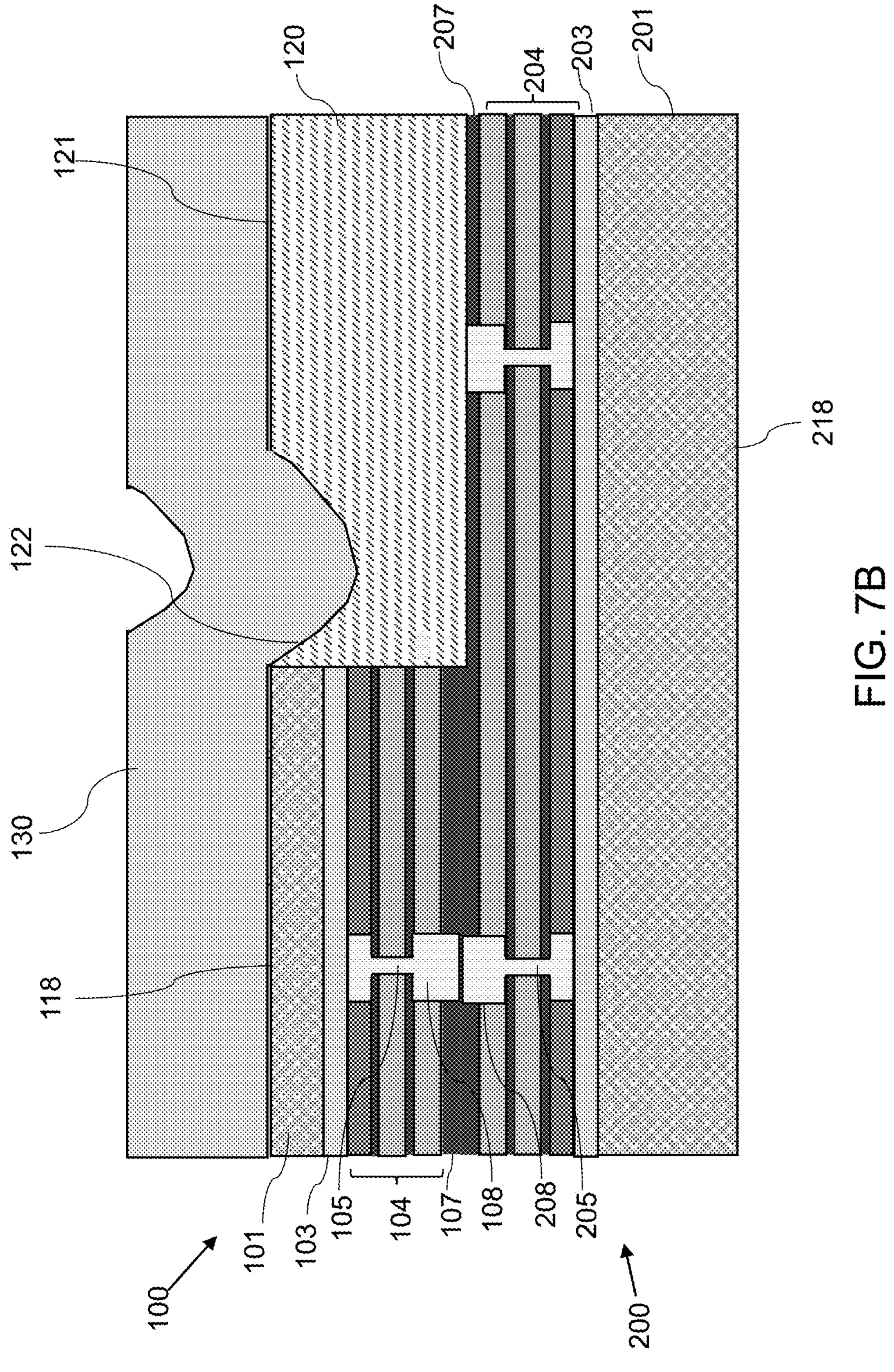
FIG. 7B is a vertical cross-section view of the intermediate structure including a recess fill dielectric layer formed over the backside surface of the first semiconductor die and the upper surface of the gap fill dielectric layer and within a concave recess defect in the gap fill dielectric layer according to another embodiment of the present disclosure.

FIG. 7B is a vertical cross-section view of the intermediate structure including a recess fill dielectric layer 130 formed over the backside surface 118 of the first semiconductor substrate 101 and the upper surface 121 of the gap fill dielectric layer 120 and within the concave recess defect 125 in the gap fill dielectric layer 120 according to another embodiments of the present disclosure. FIG. 7B illustrates the recess fill dielectric layer 130 filling the entire volume of a concave recess defect 125 in the gap fill dielectric layer 120 that is located outside of the first semiconductor die 100.

Figure 8A:
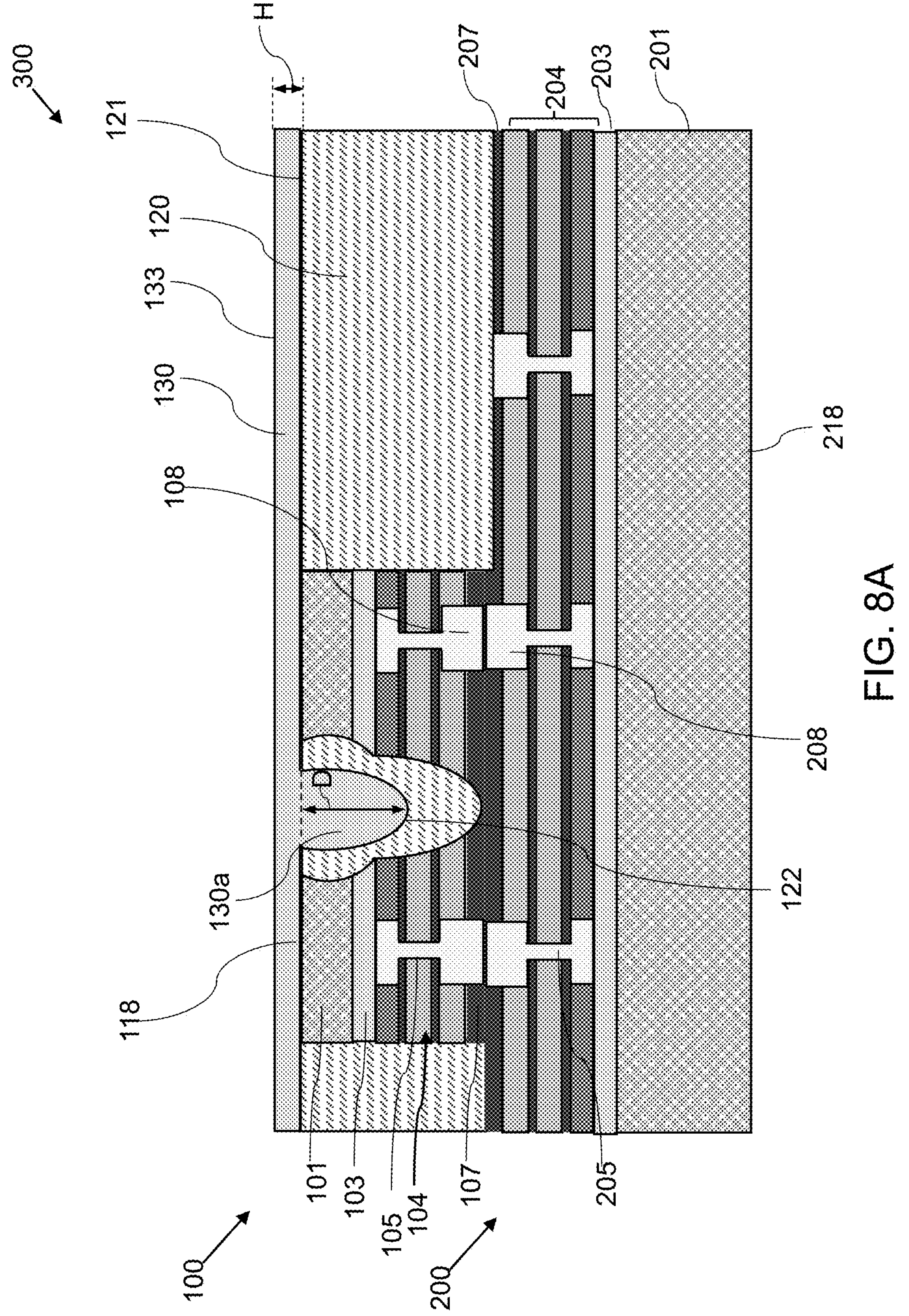
FIG. 8A is a vertical cross-section view of a vertically stacked semiconductor device following a planarization process that removes a portion of the recess fill dielectric layer from over the backside surface of the first semiconductor die and the upper surface of the gap fill dielectric layer according to an embodiment of the present disclosure.

FIG. 8A is a vertical cross-section view of a vertically stacked semiconductor device 300 following a planarization process that removes a portion of the recess fill dielectric layer 130 from over the backside surface 118 of the first semiconductor substrate 101 and the upper surface 121 of the gap fill dielectric layer 120 according to an embodiment of the present disclosure. Referring to FIG. 8A, a planarization process, such as a chemical mechanical planarization (CMP) process, may be performed to remove a portion of the recess fill dielectric layer 130 from over the backside surface 118 of the first semiconductor substrate 101 and the upper surface 121 of the gap fill dielectric layer 120. A remaining portion of the recess fill dielectric layer 130 may fill each of the above-described concave recess defects 125 in the gap fill dielectric layer 120.

Following the planarization process, the recess fill dielectric layer 130 may have a planar upper surface 133. In various embodiments, a vertical height, H, of the planar upper surface 133 of the recess fill dielectric layer 130 may be between 0 μm and about 10 μm above the backside surface 118 of the first semiconductor substrate 101 of the first semiconductor die 100. Thus, in some embodiments, the recess fill dielectric layer 130 may not extend over the backside surface 118 of the first semiconductor substrate 101 and the upper surface 121 of the gap fill dielectric layer 120 (i.e., H=0 μm) such that the backside surface 118 of the first semiconductor substrate 101, the upper surface 121 of the gap fill dielectric layer 120, and the upper surface 133 of the recess fill dielectric layer 130 may form a continuous upper surface of the vertically stacked semiconductor device 300. In other embodiments in which H>0 μm, the recess fill dielectric layer 130 may extend over the backside surface 118 of the first semiconductor substrate 101 and the upper surface 121 of the gap fill dielectric layer 120 as shown in FIG. 8A such that the upper surface 133 of the recess fill dielectric layer 130 may form a planar upper surface of the vertically stacked semiconductor device 300.

Figure 8B:
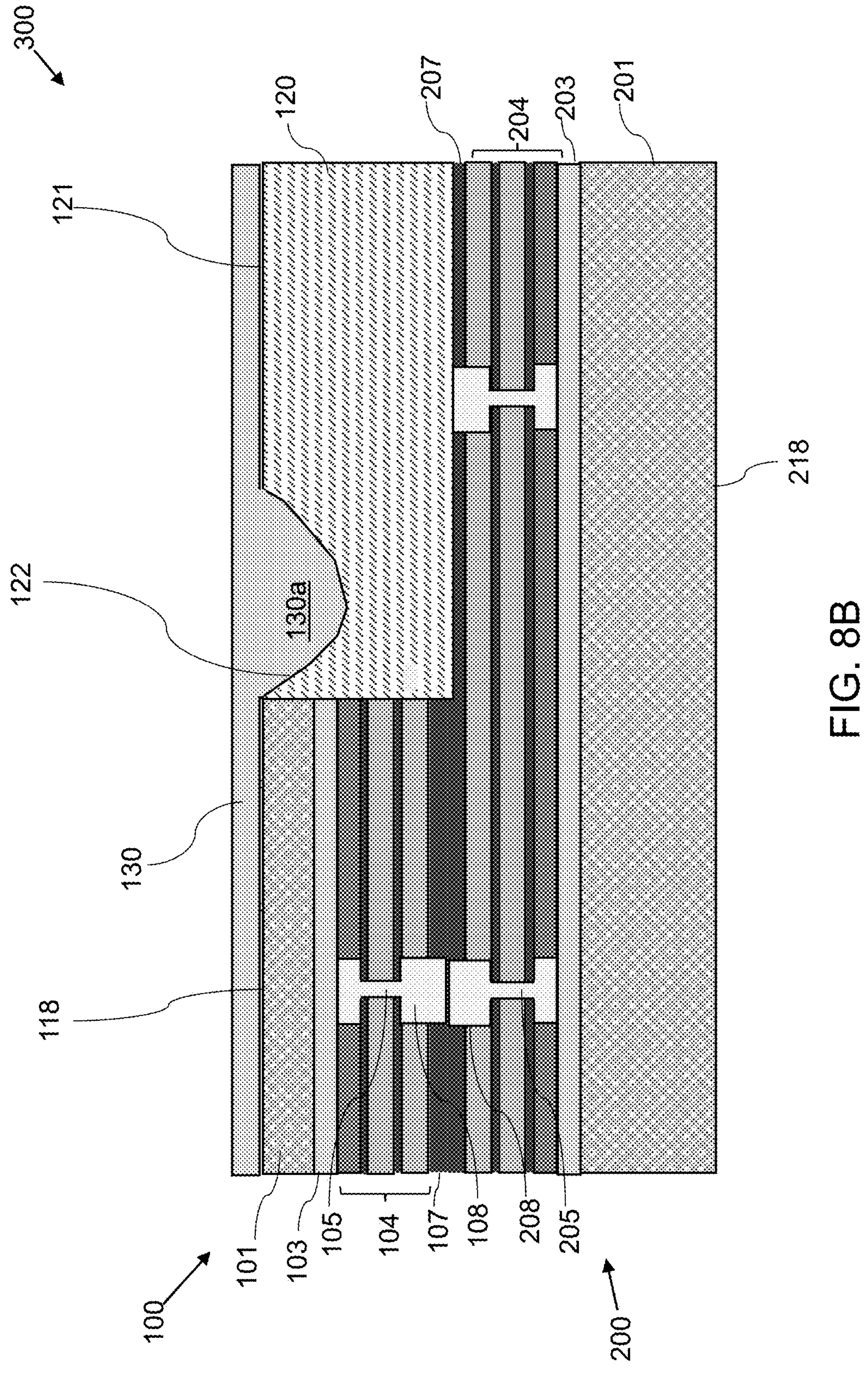
FIG. 8B is a vertical cross-section view of a vertically stacked semiconductor device following a planarization process that removes a portion of the recess fill dielectric layer from over the backside surface of the first semiconductor die and the upper surface of the gap fill dielectric layer according to another embodiment of the present disclosure.

FIG. 8B is a vertical cross-section view of a vertically stacked semiconductor device 300 following a planarization process that removes a portion of the recess fill dielectric layer 130 from over the backside surface 118 of the first semiconductor substrate 101 and the upper surface 121 of the gap fill dielectric layer 120 according to another embodiment of the present disclosure. FIG. 8B illustrates the recess fill dielectric layer 130 having a planar upper surface 133 and filling the entire volume of a concave recess defect 125 in the gap fill dielectric layer 120 that is located outside of the first semiconductor die 100.

Referring again to FIGS. 8A and 8B, vertically stacked semiconductor devices 300 are illustrated that each include a first semiconductor die 100 that is disposed over and bonded to a second device structure 200 (i.e., a second semiconductor die 200 in the embodiments of FIGS. 8A and 8B) in a face-down configuration. A gap fill dielectric layer 120 may be located over the second device structure 200 and laterally surrounding the first semiconductor die 100, where an upper surface 121 of the gap fill dielectric layer 120 is coplanar with a backside surface 118 of the first semiconductor substrate 101 of the first semiconductor die 100. The vertically stacked semiconductor device 300 further may include a recess fill dielectric layer 130 that fills at least one concave recess defect 125 in the gap fill dielectric layer 120. The concave recess defect 125 may be embedded within the first semiconductor die 100, as shown in the embodiment of FIG. 8A, or may be located outside of the first semiconductor die 100, as shown in the embodiment of FIG. 8B. The recess fill dielectric layer 130 includes an upper surface 133, where a vertical height, H, of the upper surface 133 of the recess fill dielectric layer 130 is between 0 μm and about 10 μm above a vertical height of the backside surface 118 of the first semiconductor substrate 101 of the first semiconductor die 100. At least one portion 130_a_ of the recess fill dielectric layer 130 extends vertically below the plane of the backside surface 118 of the first semiconductor substrate 101 by a depth, D. In various embodiments, the depth D may be at least about 5 μm. In some embodiments, the gap fill dielectric layer 120 may surround the at least one portion 130_a_ of the recess fill dielectric layer 130 that extends vertically below the plane of the backside surface 118 of the first semiconductor substrate 101 around the lower and lateral side surfaces of the at least one portion 130_a_. In some embodiments, the at least one portion 130_a_ of the recess fill dielectric layer 130 that extends vertically below the plane of the backside surface 118 of the first semiconductor substrate 101 may have a maximum width dimension along at least one horizontal direction that is about 10 μm or less. In various embodiments, the recess fill dielectric layer 130 may protect against plasma-induced arcing damage during subsequent processing of the vertically stacked semiconductor device by filling concave recess defects 125 in the gap fill dielectric layer 120, thereby improving device yields.

Figure 9A:
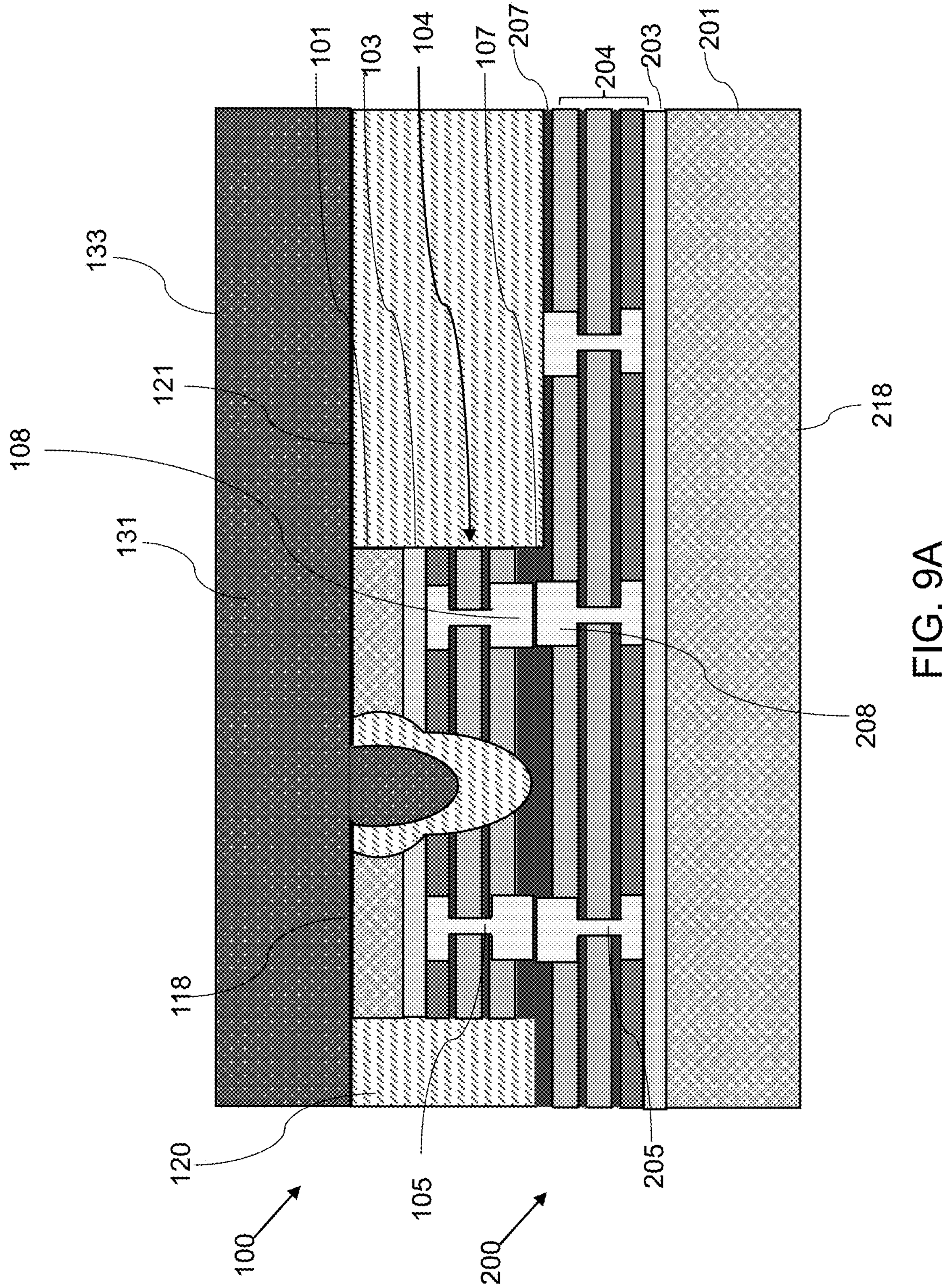
FIG. 9A is a vertical cross-section view of the intermediate structure including a recess fill dielectric layer formed over the backside surface of the first semiconductor die and the upper surface of the gap fill dielectric layer and within the concave recess defect in the gap fill dielectric layer according to another embodiment of the present disclosure.

FIG. 9A is a vertical cross-section view of the intermediate structure including a recess fill dielectric layer 131 formed over the backside surface 118 of the first semiconductor substrate 101 and the upper surface 121 of the gap fill dielectric layer 120 and within the concave recess defect 125 in the gap fill dielectric layer 120 according to another embodiment of the present disclosure. The intermediate structure shown in FIG. 9A may be derived from the intermediate structure described above with reference to FIG. 7A. Thus, repeated discussion of like components is omitted for brevity. The intermediate structure of FIG. 9A differs from the exemplary intermediate structure of FIG. 7A in that the recess fill dielectric layer 131 in the embodiment shown in FIG. 9A is composed of an organic dielectric fill material, such as an epoxy resin-based fill material having low-viscosity and high-solid filler content. In one non-limiting embodiment, the recess fill dielectric layer 131 may include or be composed of a material having a viscosity between about 50 Pa·s and about 300 Pa·s. In some embodiments, the recess fill dielectric layer 131 may include or be composed of a material having a filler content between about 50-90% by weight. In some embodiments, the recess fill dielectric layer 131 may include a molding underfill (MUF) material.

Referring again to FIG. 9A, the recess fill dielectric layer 131 may be applied using a suitable deposition process, such as a spin-coating process. Other suitable deposition processes are within the contemplated scope of disclosure. The material of the recess fill dielectric layer 131 may be applied in a sufficient quantity to fill the entire volume of each of the above-described concave recess defects 125 in the gap fill dielectric layer 120. Following the deposition process, a portion of the recess fill dielectric layer 131 may be located over the backside surface 118 of the first semiconductor substrate 101 and the upper surface 121 of the gap fill dielectric layer 120. The material of the recess fill dielectric layer 131 may optionally be subjected to a curing process following the deposition of the recess fill dielectric layer 131.

Figure 9B:
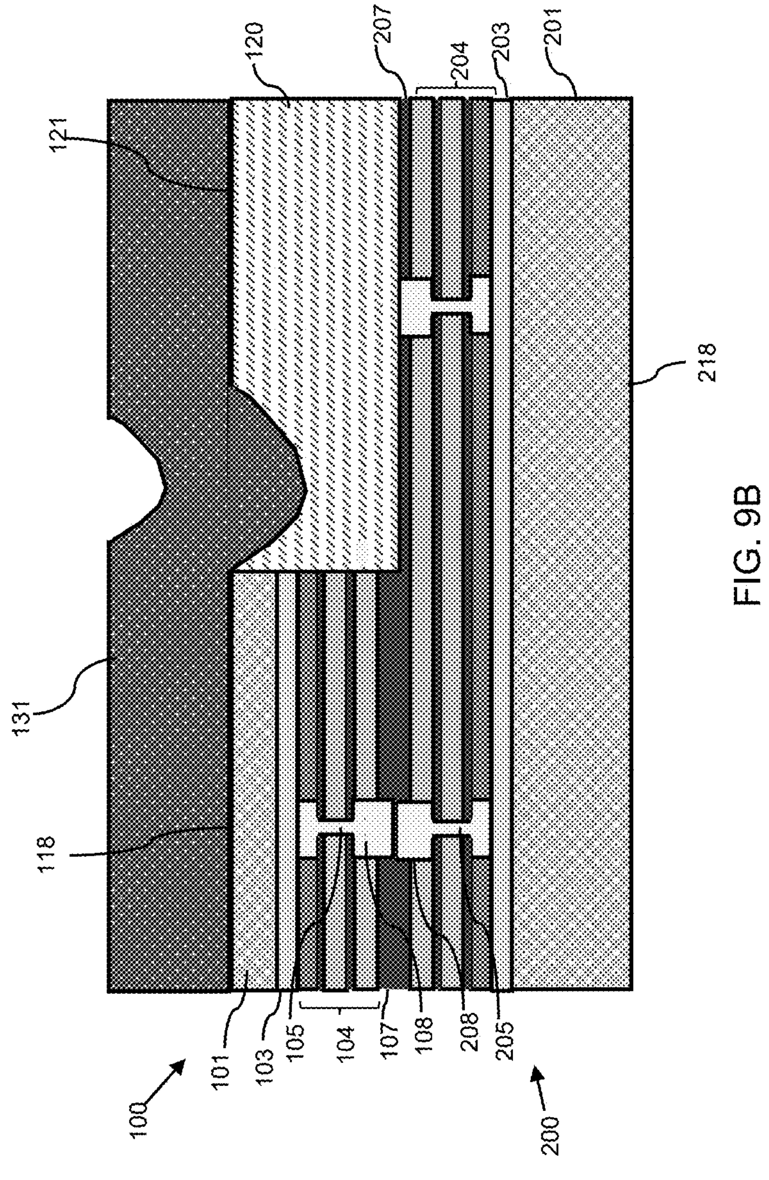
FIG. 9B is a vertical cross-section view of the intermediate structure including a recess fill dielectric layer formed over the backside surface of the first semiconductor die and the upper surface of the gap fill dielectric layer and within the concave recess defect in the gap fill dielectric layer according to another embodiment of the present disclosure.

FIG. 9B is a vertical cross-section view of the intermediate structure including a recess fill dielectric layer 131 formed over the backside surface 118 of the first semiconductor substrate 101 and the upper surface 121 of the gap fill dielectric layer 120 and within the concave recess defect 125 in the gap fill dielectric layer 120 according to another embodiment of the present disclosure. The recess fill dielectric layer 131 in the embodiment shown in FIG. 9B may include or be composed of an organic dielectric fill material as described above with reference to FIG. 9A. The embodiment of FIG. 9B may differ from the embodiment of FIG. 9A in that the recess fill dielectric layer 131 that may include or be composed of an organic dielectric fill material may fill a concave recess defect 125 in the gap fill dielectric layer 120 that is located outside of the first semiconductor die 100.

Figure 10A:
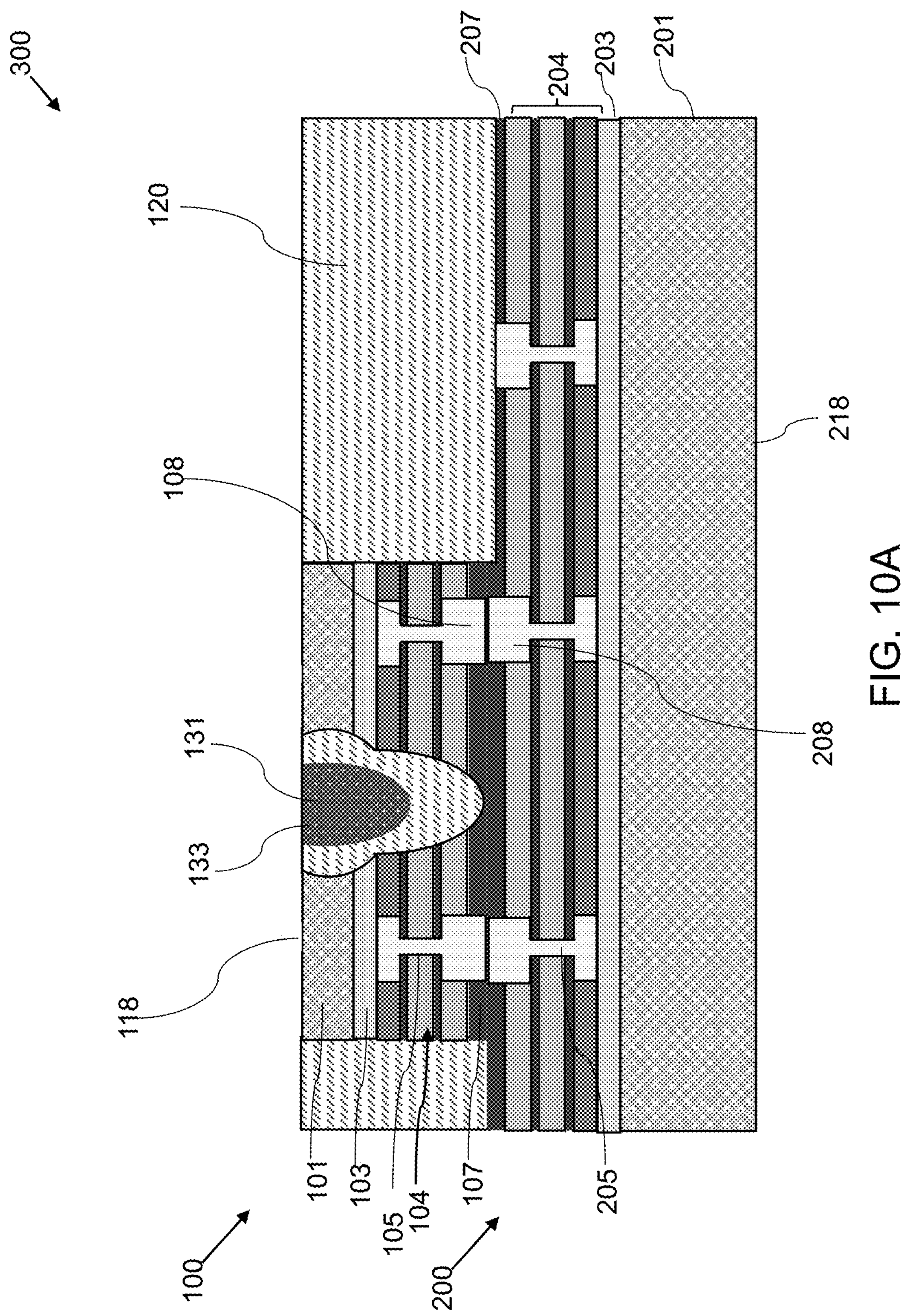
FIG. 10A is a vertical cross-section view of a vertically stacked semiconductor device following an etching process that removes a portion of the recess fill dielectric layer from over the backside surface of the first semiconductor substrate and the upper surface of the gap fill dielectric layer according to an embodiment of the present disclosure.

FIG. 10A is a vertical cross-section view of a vertically stacked semiconductor device 300 following an etching process that removes a portion of the recess fill dielectric layer 131 from over the backside surface 118 of the first semiconductor substrate 101 and the upper surface 121 of the gap fill dielectric layer 120 according to an embodiment of the present disclosure. Referring to FIG. 10A, an etching process, such as an isotropic etching process, may be utilized to remove any remaining portions of the recess fill dielectric layer 131 from over the backside surface 118 of the first semiconductor substrate 101 and the upper surface 121 of the gap fill dielectric layer 120. Following the etching process, the upper surface 133 of the recess fill dielectric layer 131 may be coplanar with the backside surface 118 of the first semiconductor substrate 101 and the upper surface 121 of the gap fill dielectric layer 120. Thus, the backside surface 118 of the first semiconductor substrate 101, the upper surface 121 of the gap fill dielectric layer 120, and the upper surface 133 of the recess fill dielectric layer 130 may form a continuous upper surface of the vertically stacked semiconductor device 300.

Figure 10B:
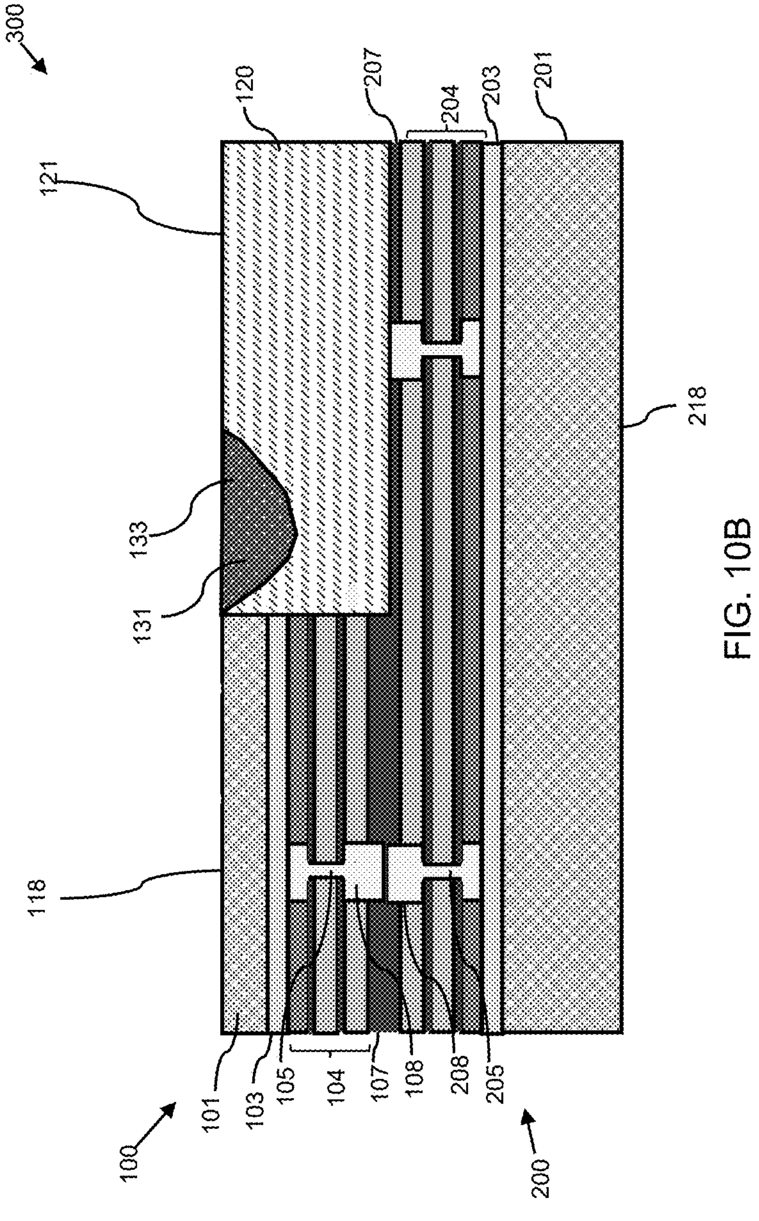
FIG. 10B is a vertical cross-section view of a vertically stacked semiconductor device following an etching process that removes a portion of the recess fill dielectric layer from over the backside surface of the first semiconductor substrate and the upper surface of the gap fill dielectric layer and according to another embodiment of the present disclosure.

FIG. 10B is a vertical cross-section view of a vertically stacked semiconductor device 300 following an etching process that removes a portion of the recess fill dielectric layer 131 from over the backside surface 118 of the first semiconductor substrate 101 and the upper surface 121 of the gap fill dielectric layer 120 according to another embodiment of the present disclosure. FIG. 10B illustrates the recess fill dielectric layer 130 filling a concave recess defect 125 located outside of the first semiconductor die 100, where the upper surface 133 of the recess fill dielectric layer 131 may be coplanar with the backside surface 118 of the first semiconductor substrate 101 and the upper surface 121 of the gap fill dielectric layer 120.

Figure 11:
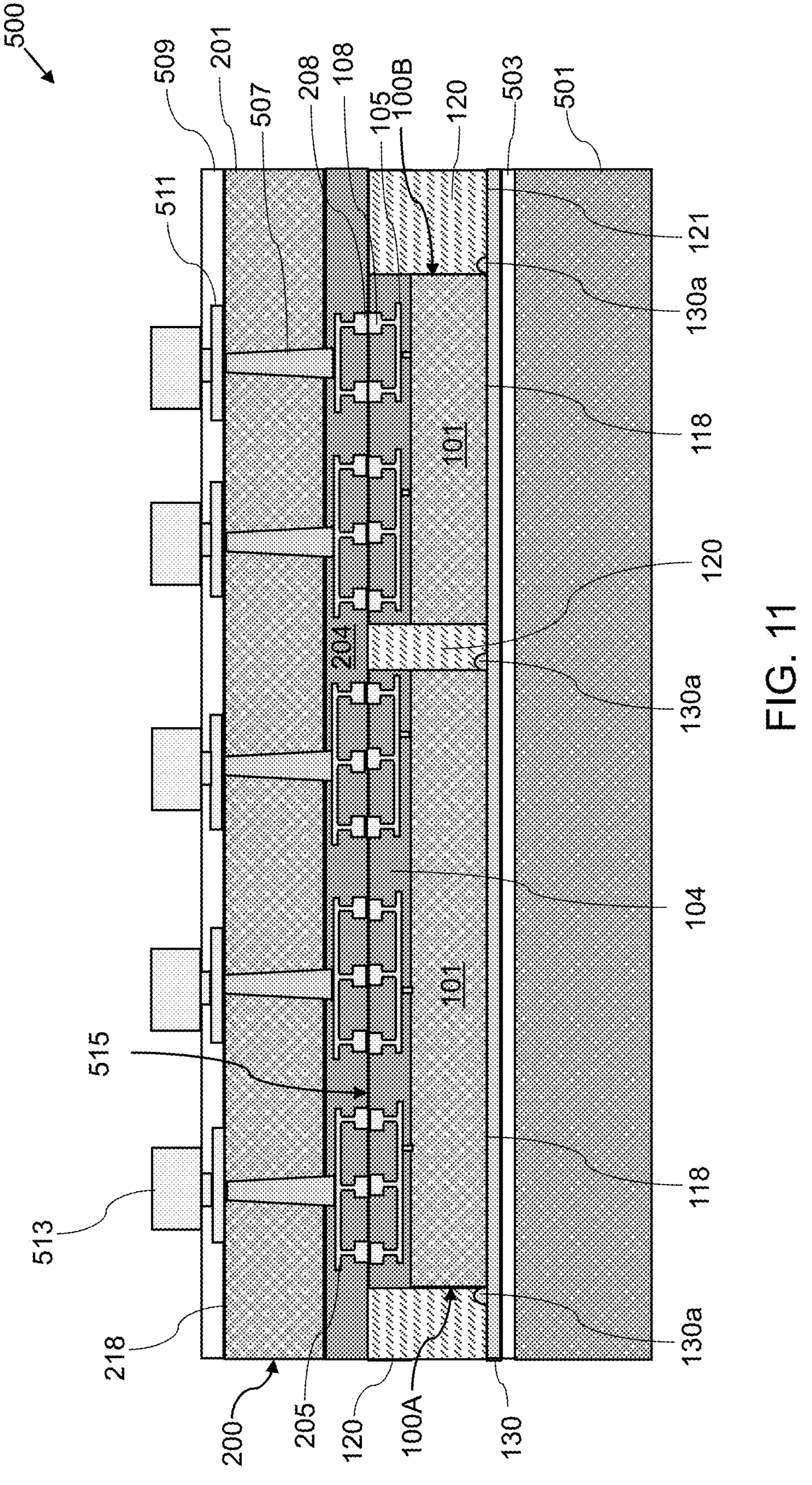
FIG. 11 is a vertical cross-section view of a vertically stacked semiconductor device including a support substrate according to an embodiment of the present disclosure.

FIG. 11 is a vertical cross-section view of a vertically stacked semiconductor device structure 500 including a support substrate 501 according to an embodiment of the present disclosure. The vertically stacked semiconductor device structure 500 shown in FIG. 11 may be derived from the vertically stacked semiconductor device structures 300 described above with reference to FIGS. 8A and 8B. Thus, repeated discussion of like components is omitted for brevity. The vertically stacked semiconductor device structure 500 of FIG. 11 differs from the structures of FIGS. 8A and 8B in that a plurality of first semiconductor dies 100A and 100B may be bonded to the second device structure 200 (e.g., a second semiconductor die 200), where each of the first semiconductor dies 100A and 100B may be laterally surrounded by a gap fill dielectric layer 120. In addition, the structure may be inverted (i.e., flipped over) relative to the orientation shown in FIGS. 8A and 8B such that the backside surfaces 118 of the first semiconductor substrates 101 are located on the bottom of each of the first semiconductor dies 100A and 100B. Accordingly, the recess fill dielectric layer 130 may extend beneath the backside surfaces 118 of the first semiconductor substrates 101 and the surface 121 of the gap fill dielectric layer 120. At least one portion 130*a* of the recess fill dielectric layer 130 may extend vertically above the plane of the backside surface 118 of the first semiconductor substrates 101 (i.e., between a plane containing the backside surfaces 118 of the first semiconductor substrates 101 and the plane of a bonding interface 515 between the first semiconductor dies 100A and 100B and the second semiconductor die 200), and may fill a concave recess defect 125 in the gap fill dielectric layer 120. The concave recess defects 125 may be embedded within a first semiconductor die 100A, 100B (as described above with reference to FIG. 8A) and/or may be located outside of the first semiconductor dies 100A, 100B (as described above with reference to FIG. 8B).

Referring again to FIG. 11, the vertically stacked semiconductor device structure 500 may additionally include a support substrate 501 located below the first semiconductor dies 100A and 100B. The support substrate 501 may include any suitable substrate material that may provide mechanical support for the vertically stacked semiconductor device structure 500. In some embodiments, the support substrate 501 may include a semiconductor material substrate, such as a silicon substrate. Other suitable substrate materials may also be utilized. A bonding layer 503 may be located between the recess fill dielectric layer 130 and the support substrate 501. The bonding layer 503 may include any suitable material that is capable of securing the support substrate 501 to the rest of the semiconductor device structure 500. In some embodiments, the bonding layer 503 may include a dielectric material, such as an oxide material (e.g., silicon oxide). Other suitable materials may be used for the bonding layer 503, such as a nitride material, an epoxy material and/or an adhesive material. The bonding layer 503 may be composed of the same material(s) as the recess fill dielectric layer 130 or may be composed of different material(s) as the recess fill dielectric layer 130.

Referring again to FIG. 11, in some embodiments, a plurality of through-substrate vias (TSVs) 507 may extend through the second semiconductor substrate 201 and may be electrically coupled to device structures and/or metal features 205 of the second semiconductor die 200. A dielectric material layer 509 may be located over the backside surface 218 of the second semiconductor substrate 201. Metal features 511 may be formed within the dielectric material layer 509, where the metal features 511 may be electrically coupled to the TSVs 507 extending through the second semiconductor substrate 201. A plurality of bonding features 513 (e.g., metal bond pads) may be located over the dielectric material layer 509 and electrically coupled to the metal features 511.

Figure 12:
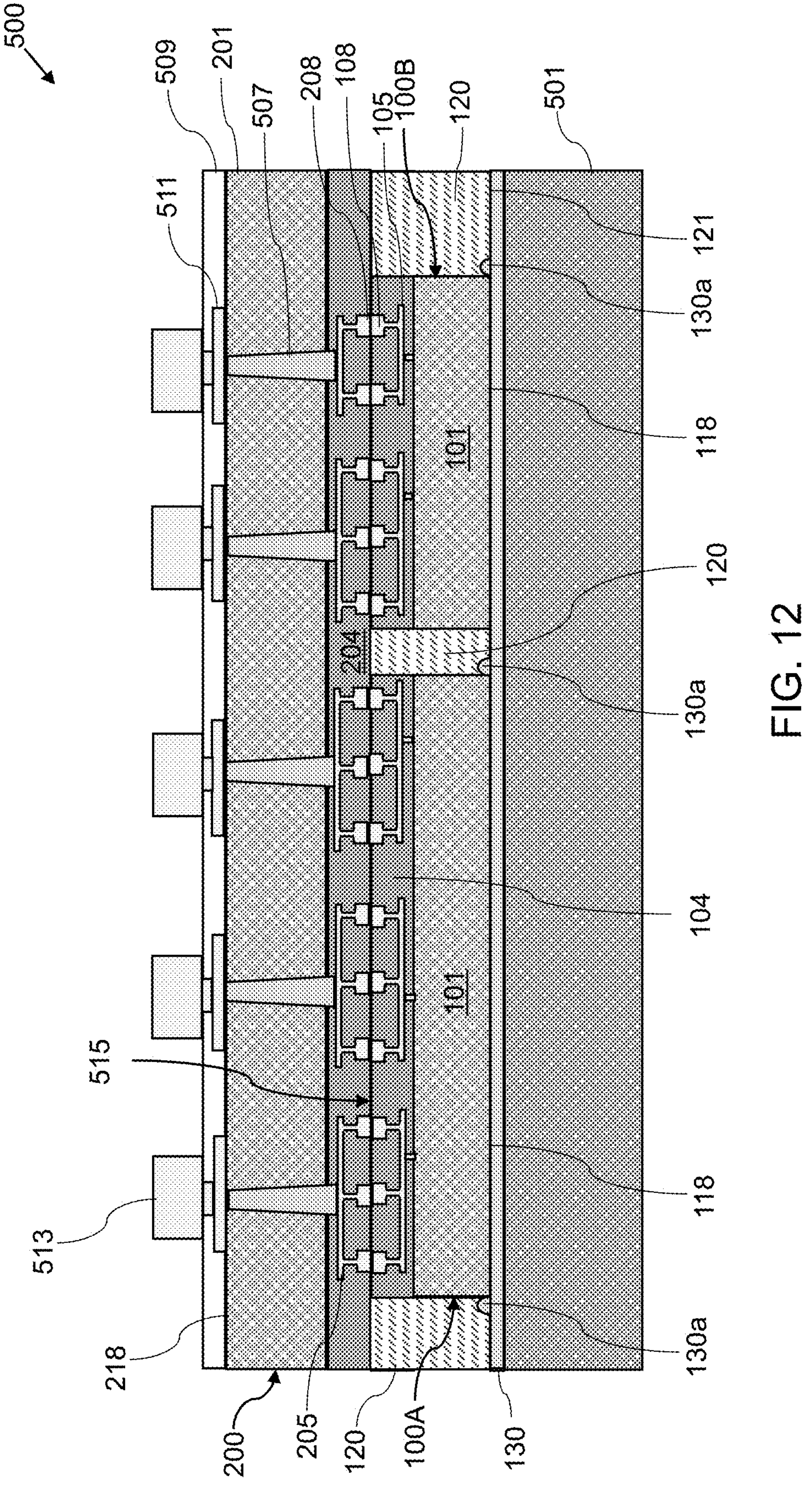
FIG. 12 is a vertical cross-section view of a vertically stacked semiconductor device including a support substrate according to another embodiment of the present disclosure.

FIG. 12 is a vertical cross-section view of a vertically stacked semiconductor device 500 including a support substrate 501 according to another embodiment of the present disclosure. The vertically stacked semiconductor device structure 500 shown in FIG. 12 is similar to the semiconductor device structure 500 described above with reference to FIG. 11. Thus, repeated discussion of like components is omitted for brevity. The vertically stacked semiconductor device structure 500 of FIG. 12 differs from the structure of FIG. 11 in that the bonding layer 503 between the recess fill dielectric layer 130 and the support substrate 501 is omitted in the vertically stacked semiconductor device structure 500 of FIG. 12. Thus, the recess fill dielectric layer 130 may directly contact the support substrate 501. The recess fill dielectric layer 130 may adhere the support substrate 501 to the overlying structures, including the backside surfaces 118 of the first semiconductor material substrates 101 and the gap fill dielectric material 120.

Figure 13:
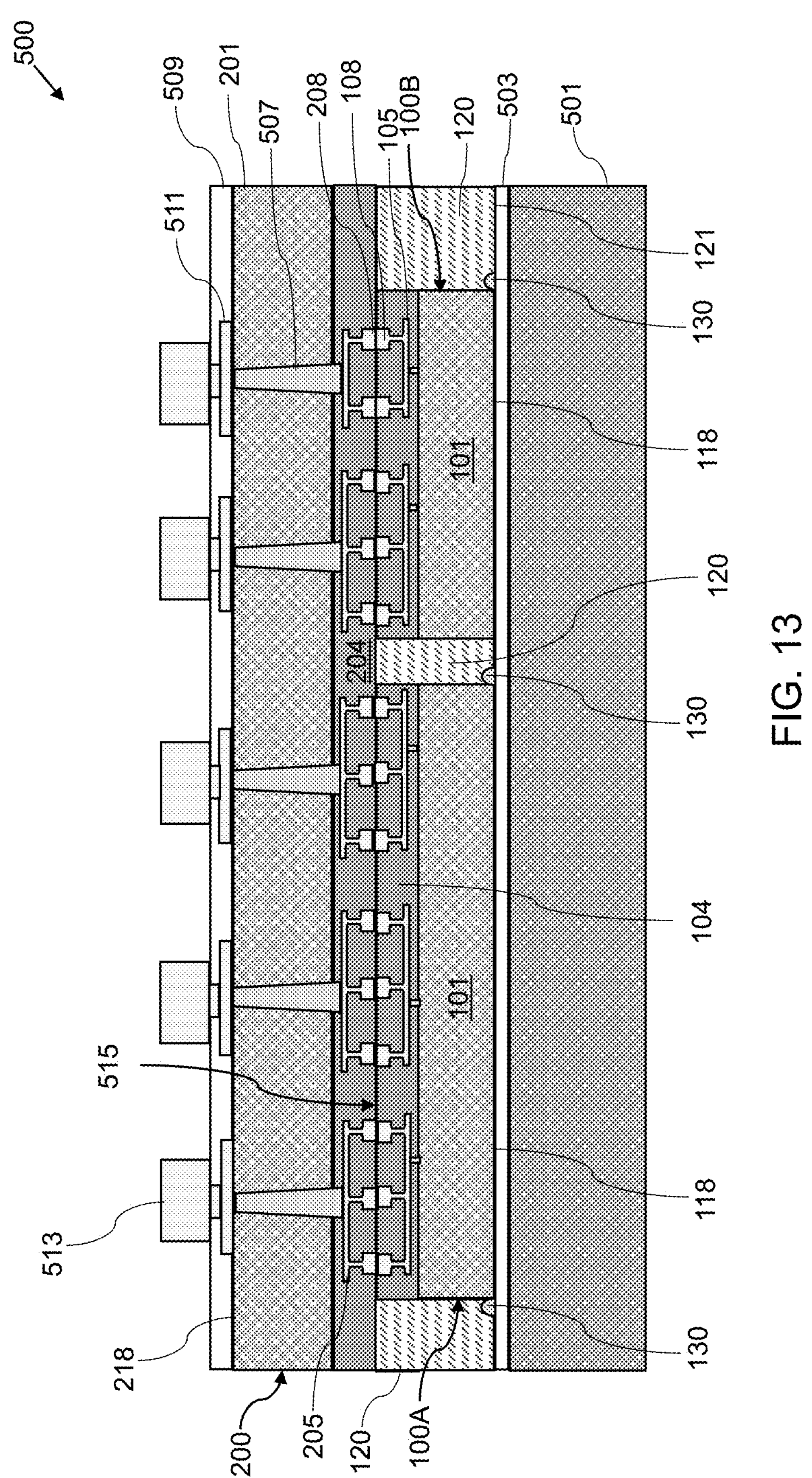
FIG. 13 is a vertical cross-section view of a vertically stacked semiconductor device including a support substrate according to another embodiment of the present disclosure.

FIG. 13 is a vertical cross-section view of a vertically stacked semiconductor device 500 including a support substrate 501 according to another embodiment of the present disclosure. The vertically stacked semiconductor device structure 500 shown in FIG. 13 is similar to the semiconductor device structure 500 described above with reference to FIG. 11. Thus, repeated discussion of like components is omitted for brevity. The vertically stacked semiconductor device structure 500 shown in FIG. 13 may differ from the structure shown in FIG. 12 in that a lower surface of the recess fill dielectric layer 130 may be coplanar with the backside surfaces 118 of the first semiconductor material substrates 101. That is, the portions of the recess fill dielectric layer 130 over the backside surface 118 of the first semiconductor substrate 101 and the upper surface 121 of the gap fill dielectric layer 120 may be removed as described above with reference to FIGS. 10A and 10B such that one or more discrete portions of the recess fill dielectric layer 130 may remain above the plane of the backside surfaces 118 of the first semiconductor substrates 101 (i.e., between a plane containing the backside surfaces 118 of the first semiconductor substrates 101 and the plane of a bonding interface 515 between the first semiconductor dies 100A and 100B and the second semiconductor die 200). Each of the discrete portions of the recess fill dielectric layer 130 may fill a concave recess defect 125 in the gap fill dielectric layer 120. The recess fill dielectric layer 130 may include a suitable dielectric material, such as an oxide material as described above with reference to FIGS. 7A-8B or an organic dielectric fill material as described above with reference to FIGS. 9A-10B. The backside surfaces 118 of the first semiconductor substrates 101, the lower surface 121 of the gap fill dielectric layer 120 and the lower surfaces of each of the discrete portions of the recess fill dielectric layer 130 may form a continuous surface that may contact an above-described bonding layer 503 located between the continuous surface and the support substrate 501.

Figure 14:
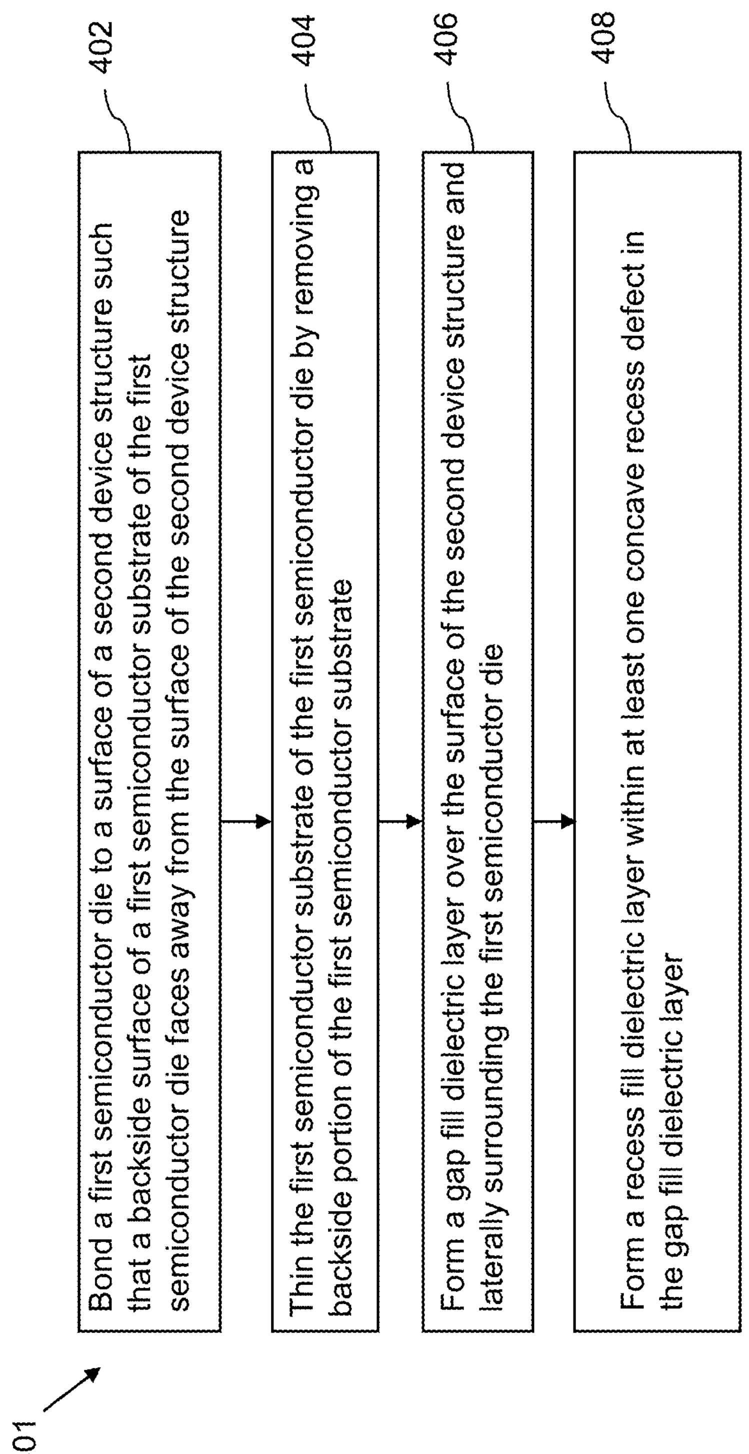
FIG. 14 is a flowchart illustrating a method of fabricating a vertically stacked semiconductor device according to an embodiment of the present disclosure.

FIG. 14 is a flowchart illustrating a method 401 of fabricating a vertically stacked semiconductor device 300 according to an embodiment of the present disclosure. Referring to FIGS. 1A, 1B, 2 and 14, in step 402 of method 401, a first semiconductor die 100 may be bonded to a surface of a second device structure 200 such that a backside surface 118 of a first semiconductor substrate 101 of the first semiconductor die 100 faces away from the surface of the second device structure 200.

Referring to FIGS. 3, 4 and 14, in step 404 of method 401, the first semiconductor substrate 101 of the first semiconductor die 100 may be thinned by removing a backside portion of the first semiconductor substrate 101. Referring to FIGS. 5, 6 and 14, in step 406 of method 401, a gap fill dielectric layer 120 may be formed over the surface of the second device structure 200 and laterally surrounding the first semiconductor die 100.

Referring to FIGS. 7A, 7B, 8A, 8B, 9A, 9B, 10A, 10B and 14, in step 408 of method 401, a recess fill dielectric layer 130 may be formed within at least one concave recess defect 125 in the gap fill dielectric layer 120. In some embodiments, a vertical height H of the upper surface 133 of the recess fill dielectric layer 130 is between 0 μm and 10 μm above the backside surface 118 of the first semiconductor substrate 101.

Referring to all drawings and according to various embodiments of the present disclosure, a semiconductor device 300 includes a first semiconductor die 100 having a first semiconductor substrate 101, a second device structure 200, the first semiconductor die 100 bonded to a surface of the second device structure 200 such that a backside surface 118 of the first semiconductor substrate 101 faces away from the surface of the second device structure 200, a gap fill dielectric layer 120 over the surface of the second device structure 200 and laterally surrounding the first semiconductor die 100, and a recess fill dielectric layer 130, 131 located within at least one concave recess defect 125 in the gap fill dielectric layer 120. In one embodiment, the upper surface of the recess fill dielectric layer 130, 131 has a vertical height that is between 0 μm and 10 μm above the backside surface 118 of the first semiconductor substrate 101.

In another embodiment, the upper surface 133 of the recess fill dielectric layer 130, 131, an upper surface 121 of the gap fill dielectric layer 120 and the backside surface 118 of the first semiconductor substrate 101 may form a continuous surface of the first semiconductor device 100.

In another embodiment, the recess fill dielectric layer 130, 131 may include a planar upper surface 133 that extends over an upper surface 121 of the gap fill dielectric layer 120 and the backside surface 118 of the first semiconductor substrate 101.

In another embodiment, the first semiconductor substrate 101 may have a thickness of 50 μm to 100 μm and includes at least one crack within or through the first semiconductor substrate 101, and the at least one concave recess defect 125 in the gap fill dielectric layer 120 may be located adjacent to the at least one crack 115.

In another embodiment, at least one portion **130*a* of the recess fill dielectric layer 130, 131 may extend to a vertical depth D of at least 5 μm below the backside surface 118 of the first semiconductor substrate 101 and is surrounded by the gap fill dielectric layer 120 on bottom and side surfaces of the at least one portion 130*a* of the recess fill dielectric layer 130, 131**.

In another embodiment, the gap fill dielectric layer 120 and the recess fill dielectric layer 130, 131 comprise a same material with an interface 122 between the gap fill dielectric layer 120 and the recess fill dielectric layer 130, 131.

In another embodiment, the gap fill dielectric layer 120 and the recess fill dielectric layer 130, 131 may be composed of different materials.

In another embodiment, the recess fill dielectric layer 131 may include an organic dielectric material.

Another embodiment is drawn to a semiconductor device 300 that includes a first semiconductor die 100 having a first semiconductor substrate 101, a second device structure 200, the first semiconductor die 100 bonded to a surface of the second device structure 200 such that a backside surface 118 of the first semiconductor substrate 101 faces away from the surface of the second device structure 200, a gap fill dielectric layer 120 over the surface of the second device structure 200 and laterally surrounding the first semiconductor die 100, the gap fill dielectric layer 120 including an upper surface 121 with at least one concave recess defect 125 having a vertical depth of 5 μm or more with respect to the upper surface 121 of the gap fill dielectric layer 120, and a recess fill dielectric material 130, 131 filling the concave recess defects 125 in the gap fill dielectric layer 120.

In one embodiment, the recess fill dielectric material 130, 131 may include at least one of an oxide material and an organic material.

In another embodiment, the recess fill dielectric material 131 may include a molding underfill (MUF) material.

In another embodiment, the second device structure 200 may include a second semiconductor die 200 having a second semiconductor substrate 201, and a front side of the first semiconductor die 100 opposite the first semiconductor substrate 101 is bonded to a front side of the second semiconductor die 200 opposite the second semiconductor substrate 201 by a metal-metal 108, 208 and dielectric-dielectric 109, 209 direct bond.

In another embodiment, the second device structure 200 may include a second semiconductor die 200 having a second semiconductor substrate 201, and a front side of the first semiconductor die 100 opposite the first semiconductor substrate 101 is bonded to a backside 218 of the second semiconductor substrate 201 by a plurality of bonding features.

Another embodiment is drawn to a method of fabricating a vertically stacked semiconductor device 300 that includes bonding a first semiconductor die 100 to a surface of a second device structure 200 such that a backside surface 118 of a first semiconductor substrate 101 of the first semiconductor die 100 faces away from the surface of the second device structure 200, thinning the first semiconductor substrate 101 of the first semiconductor die 100 by removing a backside portion of the first semiconductor substrate 101, forming a gap fill dielectric layer 120 over the surface of the second device structure 200 and laterally surrounding the first semiconductor die 100, forming a recess fill dielectric layer 130, 131 within at least one concave recess defect 125 in the gap fill dielectric layer 120.

In one embodiment, the first semiconductor substrate 101 may be thinned by grinding the first semiconductor substrate 101 to remove the backside portion of the first semiconductor substrate 101, forming the gap fill dielectric layer 120 includes depositing a first dielectric material layer 120 over the second device structure 200, side surfaces of the first semiconductor die 100 and the backside surface 118 of the first semiconductor substrate 101, and performing a first planarization process to remove portions of the first dielectric material 120 from over the backside surface 118 of the first semiconductor substrate 101, and forming the recess fill dielectric layer 130, 131 includes depositing a second dielectric material layer 130, 131 over the backside surface 118 of the first semiconductor substrate 101 and an upper surface 121 of the gap fill dielectric layer 120, and performing a second planarization process to remove portions of the second dielectric material layer 130, 131 and provide a planar upper surface 133 of the recess fill dielectric layer 130, 131, wherein following the second planarization process, a vertical height of the upper surface 133 of the recess fill dielectric layer 130, 131 is between 0 μm and 10 μm above the backside surface 118 of the first semiconductor substrate 101.

In another embodiment, the first planarization process and the second planarization process include chemical mechanical planarization (CMP) processes, and the planar upper surface 133 of the recess fill dielectric layer 130 extends over the backside surface 118 of the first semiconductor substrate 101 and the upper surface 121 of the gap fill dielectric layer 120.

In another embodiment, the recess fill dielectric layer 130 is deposited via at least one of a selective oxidation process and a high-density plasma chemical vapor deposition (HDP-CVD) process.

In another embodiment, the recess fill dielectric layer 131 includes an organic dielectric material 131 that is deposited by a spin coating process, and performing the second planarization process includes performing an etching process to remove the organic dielectric material 131 from over the backside surface 118 of the first semiconductor substrate 101 and the upper surface 121 of the gap fill dielectric layer 120.

In another embodiment, the recess fill dielectric layer 131 has a viscosity of 50 to 300 Pa·s and a filler content of 50 to 90% by weight.

The foregoing outlines features of several embodiments so that those skilled in the art may better understand the aspects of this disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of this disclosure, and that they may make various changes, substitutions, and alterations herein without departing from the spirit and scope of the present disclosure.

What is claimed is:

1. A method of fabricating a vertically stacked semiconductor device, comprising:

bonding a first semiconductor die to a surface of a second device structure such that a backside surface of a first semiconductor substrate of the first semiconductor die faces away from the surface of the second device structure;

thinning the first semiconductor substrate of the first semiconductor die by removing a backside portion of the first semiconductor substrate;

forming a gap fill dielectric layer over the surface of the second device structure and laterally surrounding the first semiconductor die;

performing a planarization process on the gap fill dielectric layer, wherein following the planarization process the gap fill dielectric layer includes at least one concave recess defect; and forming a recess fill dielectric layer within the at least one concave recess defect in the gap fill dielectric layer.

2. The method of claim 1, wherein:

the first semiconductor substrate is thinned by grinding the first semiconductor substrate to remove the backside portion of the first semiconductor substrate;

forming the gap fill dielectric layer comprises depositing a first dielectric material layer over the second device structure, side surfaces of the first semiconductor die and the backside surface of the first semiconductor substrate, and performing the planarization process comprises performing a first planarization process to remove portions of the first dielectric material from over the backside surface of the first semiconductor substrate; and forming the recess fill dielectric layer comprises depositing a second dielectric material layer over the backside surface of the first semiconductor substrate and an upper surface of the gap fill dielectric layer, and performing a second planarization process to remove portions of the second dielectric material layer and provide a planar upper surface of the recess fill dielectric layer, wherein following the second planarization process, a vertical height of the planar upper surface of the recess fill dielectric layer is between 0 μm and 10 μm above the backside surface of the first semiconductor substrate.

3. The method of claim 2, wherein the first planarization process and the second planarization process comprise chemical mechanical planarization (CMP) processes.

4. The method of claim 2, wherein the recess fill dielectric layer is deposited via a selective oxidation.

5. The method of claim 2, wherein the recess fill dielectric layer comprises an organic dielectric material that is deposited by a spin coating process.

6. The method of claim 5, wherein the recess fill dielectric layer has a viscosity of 50 to 300 Pa·s and a filler content of 50 to 90% by weight.

7. The method of claim 5, wherein performing the second planarization process comprises performing an etching process to remove the organic dielectric material from over the backside surface of the first semiconductor substrate and the upper surface of the gap fill dielectric layer.

8. The method of claim 2, wherein the recess fill dielectric layer is deposited via a high-density plasma chemical vapor deposition (HDP-CVD) process.

9. The method of claim 1, wherein thinning the first semiconductor substrate of the first semiconductor die produces a crack in the first semiconductor substrate, wherein the gap fill dielectric layer partially fills a volume of the crack.

10. The method of claim 9, wherein a portion of the recess fill dielectric layer fills a remaining volume of the crack.

11. The method of claim 10, wherein the portion of the recess fill dielectric layer that fills the remaining volume of the crack is surrounded on a bottom surface and on side surfaces by the gap fill dielectric layer.

12. The method of claim 11, wherein the portion of the recess fill dielectric layer that fills the remaining volume of the crack is surrounded by the first semiconductor substrate on at least two sides.

13. The method of claim 11, wherein the bottom surface of the recess fill dielectric layer is located below a plane of the backside surface of the first semiconductor substrate by 5 μm or more.

14. The method of claim 11, wherein the portion of the recess fill dielectric layer that fills the remaining volume of the crack has a maximum width dimension of 10 μm or less.

15. A method of fabricating a vertically stacked semiconductor device, comprising:

bonding a first semiconductor die to a surface of a second device structure such that a backside surface of a first semiconductor substrate of the first semiconductor die faces away from the surface of the second device structure;

grinding the first semiconductor substrate to remove a backside portion of the first semiconductor substrate, wherein grinding the first semiconductor substrate results in the formation of at least one crack in the first semiconductor substrate;

forming a gap fill dielectric layer over the surface of the second device structure and laterally surrounding the first semiconductor die;

planarizing the gap fill dielectric layer to provide a planar upper surface of the gap fill dielectric layer that includes a concave recess defect corresponding to a location of the crack in the first semiconductor substate; and forming a recess fill dielectric layer over the gap fill dielectric layer and within the concave recess defect; and planarizing the recess fill dielectric layer to provide a planar upper surface of the recess fill dielectric layer over the concave recess defect.

16. The method of claim 15, wherein grinding the first semiconductor substrate comprises reducing a thickness of the first semiconductor substrate from a first thickness of 500 μm to 800 μm to a second thickness of 50 μm to 100 μm.

17. The method of claim 15, wherein the first semiconductor die is bonded to the surface of the second device structure by a metal-to-metal and dielectric-to-dielectric direct bonding interface.

18. A method of reducing gap fill defects in a vertically stacked semiconductor device, comprising:

providing a first semiconductor die bonded to a second device structure;

forming a gap fill dielectric layer laterally over an upper surface and side surfaces of the first semiconductor die;

planarizing the gap fill dielectric layer to remove the gap fill dielectric layer from over an upper surface of the first semiconductor die;

depositing an organic dielectric material over the gap fill dielectric layer and the upper surface of the first semiconductor die and within at least one concave recess defect in the gap fill dielectric layer; and planarizing the organic dielectric material to provide a planar upper surface of the vertically stacked semiconductor device comprising the upper surface of the first semiconductor die, the upper surface of the gap fill dielectric layer, and an upper surface of the organic dielectric material.

19. The method of claim 18, wherein the organic dielectric material is deposited over the gap fill dielectric layer by spin-coating, and the method further comprises curing the organic dielectric material.

20. The method of claim 18, wherein the organic dielectric material comprises a molding underfill material.

* * * * *